US011001923B2

(12) United States Patent
Isobe et al.

(10) Patent No.: US 11,001,923 B2
(45) Date of Patent: May 11, 2021

(54) METHOD OF MANUFACTURING SEMICONDUCTOR DEVICE AND RECORDING MEDIUM

(71) Applicant: HITACHI KOKUSAI ELECTRIC INC., Tokyo (JP)

(72) Inventors: Noriyuki Isobe, Toyama (JP); Kenji Kameda, Toyama (JP); Koichi Oikawa, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/175,533

(22) Filed: Jun. 7, 2016

(65) Prior Publication Data

US 2016/0362784 A1 Dec. 15, 2016

(30) Foreign Application Priority Data

Jun. 9, 2015 (JP) .............................. JP2015-116991

(51) Int. Cl.
*C23C 16/44* (2006.01)
*C23C 16/455* (2006.01)
(Continued)

(52) U.S. Cl.
CPC ........ *C23C 16/4405* (2013.01); *C23C 16/405* (2013.01); *C23C 16/4404* (2013.01);
(Continued)

(58) Field of Classification Search
None
See application file for complete search history.

(56) References Cited

U.S. PATENT DOCUMENTS 6,903,025 B2 * 6/2005 Mizushima ......... C23C 16/4405
134/22.1
7,267,842 B2 * 9/2007 Wu ....................... C23C 14/083
134/1.1
(Continued)

FOREIGN PATENT DOCUMENTS

CN 1473353 A 2/2004
JP 05-331630 A 12/1993
(Continued)

OTHER PUBLICATIONS

Korean Office Action dated May 22, 2017 in the Korean Application No. 10-2016-0071290.
(Continued)

*Primary Examiner* — David E Graybill
(74) *Attorney, Agent, or Firm* — Volpe Koenig

(57) ABSTRACT

A method of manufacturing a semiconductor device includes (a) under a first process condition, supplying a purge gas containing hydrogen and oxygen to a process chamber from which an oxide film adhering to an internal member is removed by a cleaning gas containing a halogen element and exhausting the purge gas from the process chamber; and (b) under a second process condition differing from the first process condition, supplying the purge gas to the process chamber and exhausting the purge gas from the process chamber after performing (a), wherein the first process condition is a process condition under which reactivity of the halogen element, which remains within the process chamber when the cleaning gas is supplied to the process chamber, with the purge gas is higher than reactivity of the halogen element with the purge gas under the second process condition.

16 Claims, 16 Drawing Sheets

(51) Int. Cl.
*C23C 16/40* (2006.01)
*C23C 16/52* (2006.01)
*H01L 21/02* (2006.01)

(52) U.S. Cl.
CPC .... *C23C 16/4412* (2013.01); *C23C 16/45523* (2013.01); *C23C 16/45546* (2013.01); *C23C 16/45561* (2013.01); *C23C 16/52* (2013.01); *H01L 21/02186* (2013.01); *H01L 21/02271* (2013.01)

(56) References Cited

U.S. PATENT DOCUMENTS

| | | | |
|---|---|---|---|
| 8,741,783 B2* | 6/2014 | Kameda | B08B 9/08 257/E21.159 |
| 9,856,560 B2* | 1/2018 | Kameda | C23C 16/4405 |
| 2003/0224615 A1* | 12/2003 | Nishino | C23C 16/4404 438/758 |
| 2004/0002220 A1* | 1/2004 | Mizushima | C23C 16/4405 438/706 |
| 2005/0202167 A1 | 9/2005 | Wu et al. | |
| 2006/0027249 A1* | 2/2006 | Johnson | C23C 16/4405 134/1.1 |
| 2006/0165890 A1* | 7/2006 | Kaushal | C23C 16/45527 427/248.1 |
| 2008/0268644 A1 | 10/2008 | Kameda et al. | |
| 2009/0149032 A1* | 6/2009 | Kameda | C23C 16/4405 438/778 |
| 2009/0170328 A1* | 7/2009 | Kameda | C23C 16/4405 438/694 |
| 2010/0167541 A1 | 7/2010 | Kato | |
| 2011/0065283 A1 | 3/2011 | Sato et al. | |
| 2013/0017644 A1* | 1/2013 | Carter, III | C23C 16/4405 438/57 |
| 2013/0065402 A1* | 3/2013 | Kameda | B08B 9/08 438/758 |
| 2013/0171838 A1* | 7/2013 | Okuda | H01L 21/0217 438/778 |
| 2016/0362784 A1* | 12/2016 | Isobe | C23C 16/405 |

FOREIGN PATENT DOCUMENTS

| | | |
|---|---|---|
| JP | 09-148255 A | 6/1997 |
| JP | 2007-243014 A | 9/2007 |
| JP | 2008-218984 A | 9/2008 |
| JP | 2010-171389 A | 8/2010 |
| JP | 2011-058067 A | 3/2011 |
| JP | 2014-203856 A | 10/2014 |

OTHER PUBLICATIONS

Japanese Office Action dated Jul. 5, 2016 in the Japanese Application No. 2015-116991.
Chinese Office Action dated May 28, 2018 for the Chinese Patent Application No. 201610397426.4.

* cited by examiner

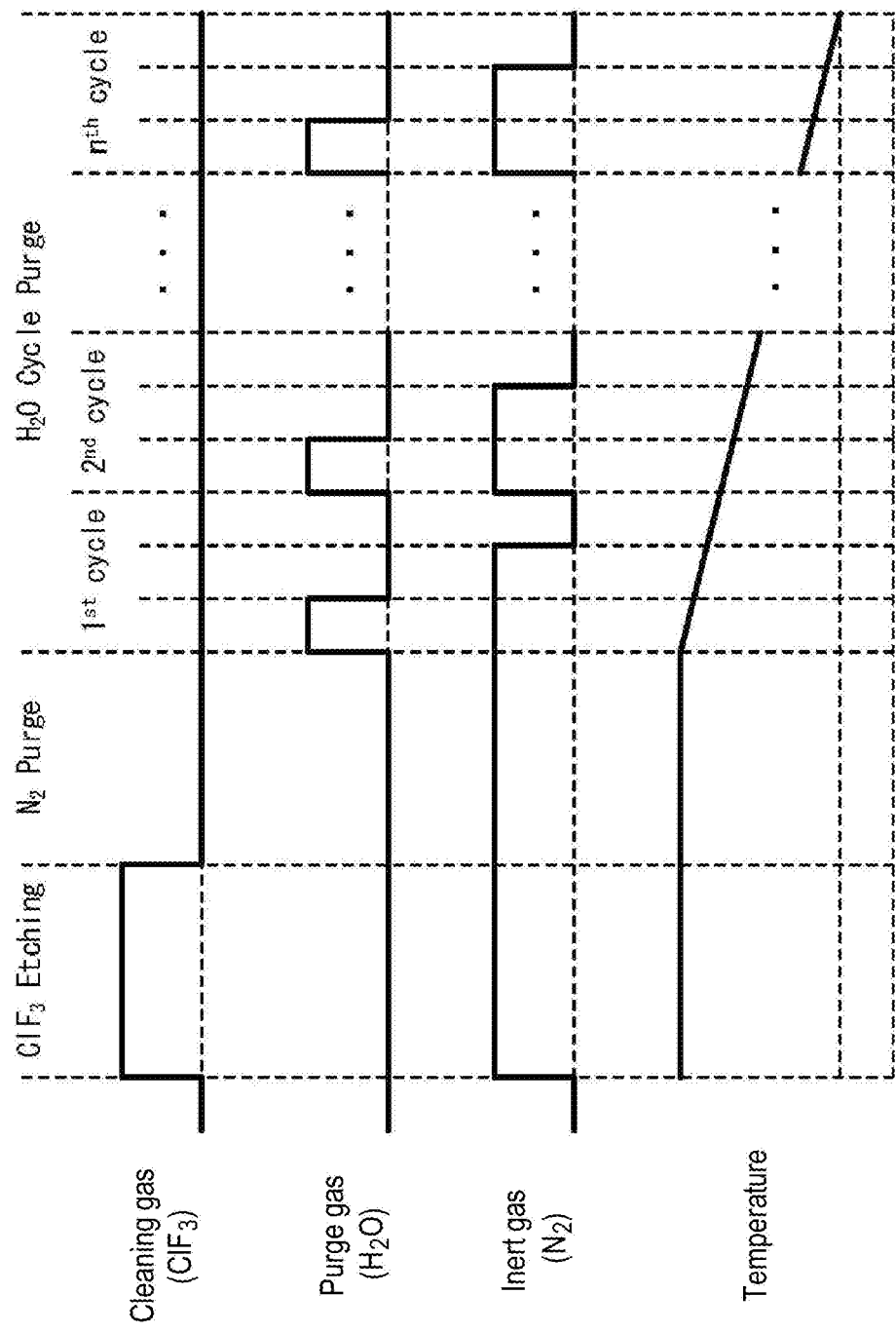

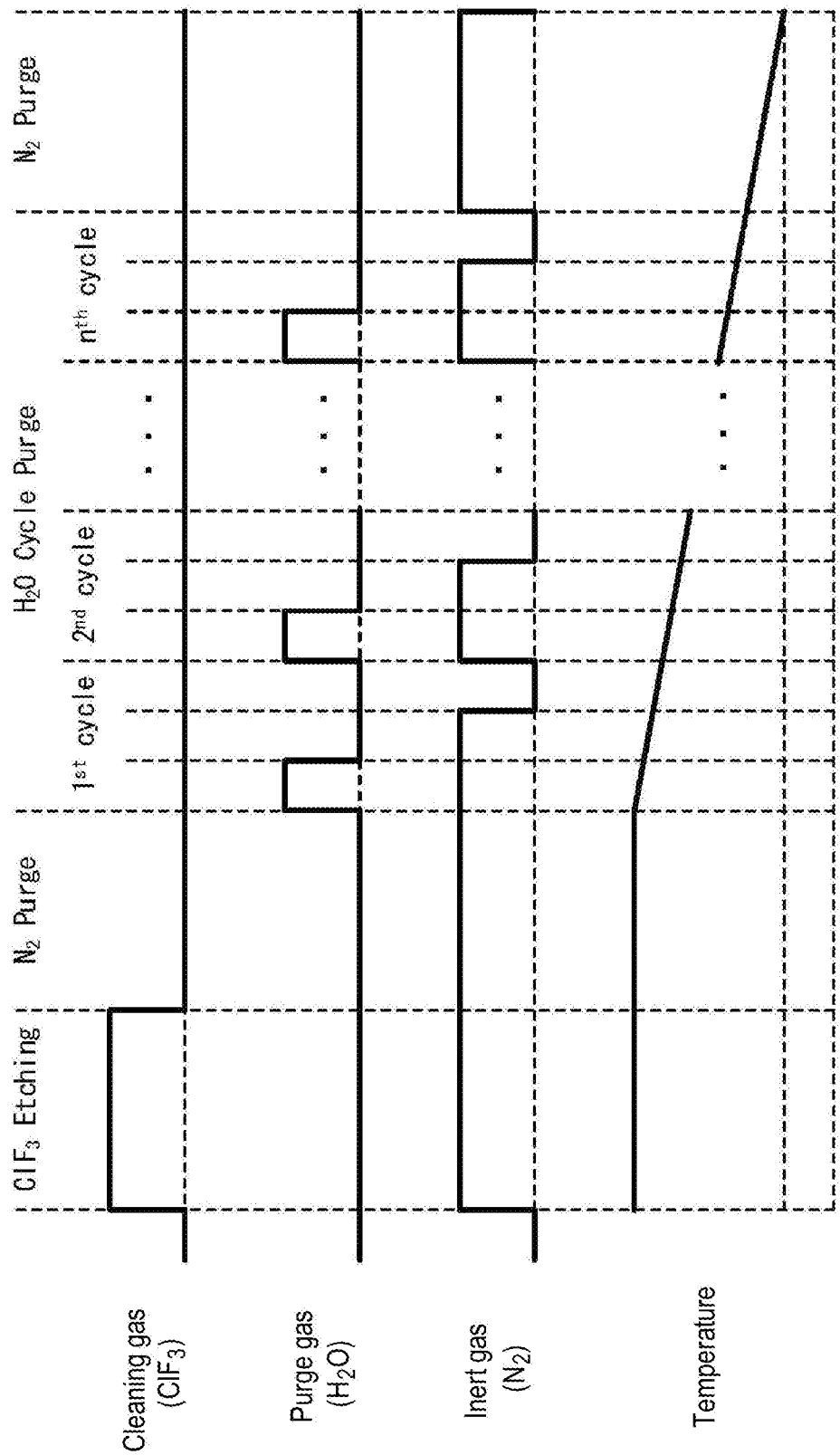

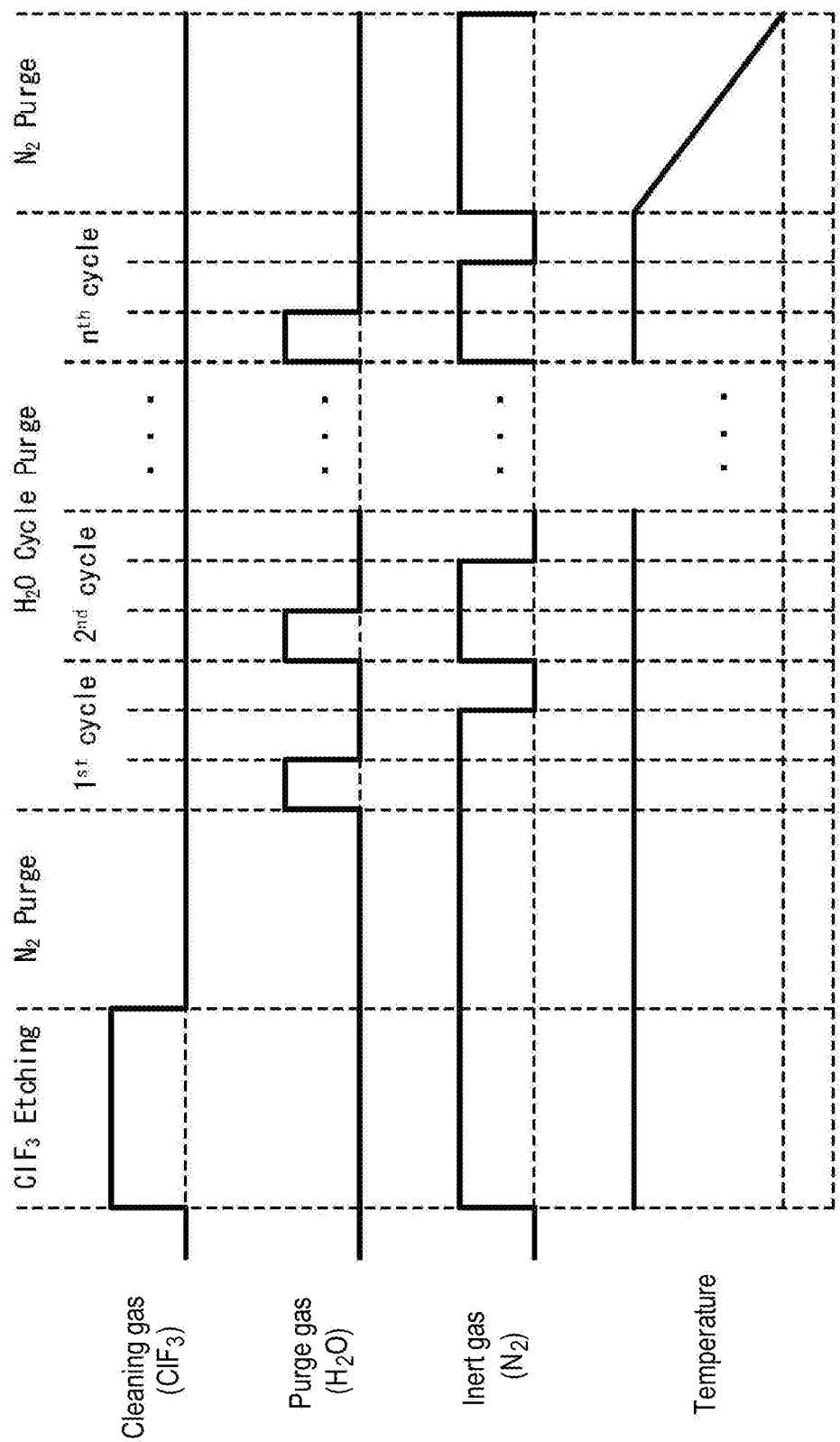

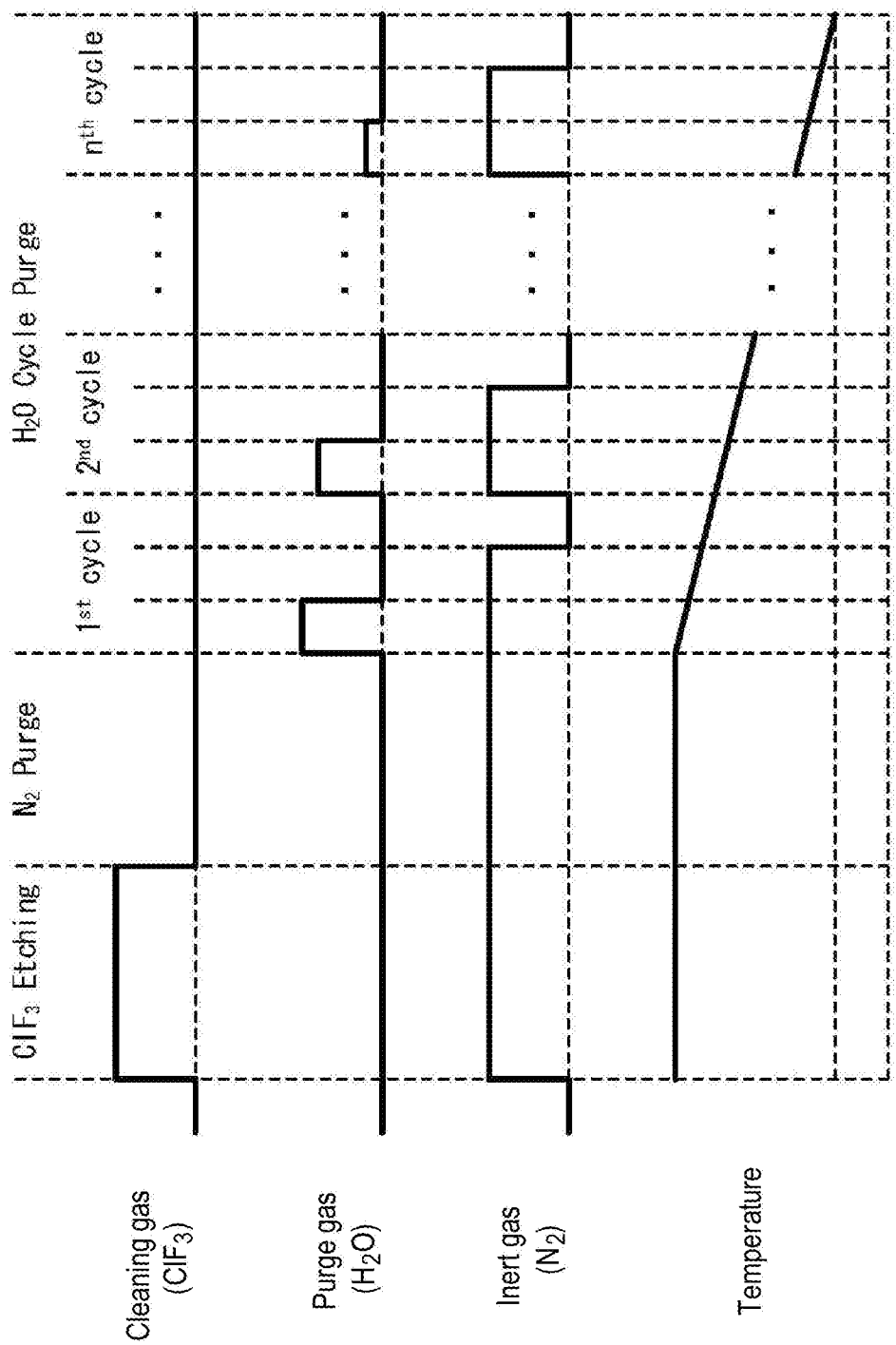

METHOD OF MANUFACTURING SEMICONDUCTOR DEVICE AND RECORDING MEDIUM

CROSS-REFERENCE TO RELATED APPLICATION(S)

This application is based upon and claims the benefit of priority from Japanese Patent Application No. 2015-116991, filed on Jun. 9, 2015, the entire contents of which are incorporated herein by reference.

TECHNICAL FIELD

The present disclosure relates to a method of manufacturing a semiconductor device, a substrate processing apparatus, and a recording medium.

BACKGROUND

As an example of processes of manufacturing a semiconductor device, a process of forming a film on a substrate accommodated within a process chamber is often carried out. When carrying out this process, deposits including a film adhere to the interior of the process chamber. Thus, a cleaning process is often performed by supplying a cleaning gas into the process chamber, after the process of forming the film has been performed, and removing the deposits adhering to the interior of the process chamber.

In this cleaning process, a cleaning gas containing a halogen element is often used. Along with the cleaning process using the cleaning gas including the halogen element, it is sometimes the case that the halogen element originating from the cleaning gas remains within the process chamber.

SUMMARY

The present disclosure provides some embodiments of a technique of removing a residual halogen element originating from a cleaning gas from an interior of a process chamber and forming a high-quality film on a substrate.

According to one embodiment of the present disclosure, there is provided a technique including:

under a first process condition, supplying a purge gas containing hydrogen and oxygen to a process chamber from which an oxide film adhering to an internal member is removed by a cleaning gas containing a halogen element and exhausting the purge gas from the process chamber; and under a second process condition differing from the first process condition, supplying the purge gas to the process chamber and exhausting the purge gas from the process chamber after the act of supplying and exhausting the purge gas under the first process condition, wherein the first process condition is a process condition under which reactivity of the halogen element, which remains within the process chamber when the cleaning gas is supplied to the process chamber, with the purge gas is higher than reactivity of the halogen element with the purge gas under the second process condition.

BRIEF DESCRIPTION OF THE DRAWINGS

FIG. 5A is a view showing gas supply timings and a change of an internal temperature of a process chamber in a cleaning process and a purge process according to the first embodiment of the present disclosure.

FIG. 6A is a view showing gas supply timings and a change of an internal temperature of a process chamber in a cleaning process and a purge process according to modification 2, and FIG. 6B is a view showing gas supply timings and a change of an internal temperature of a process chamber in a cleaning process and a purge process according to modification 3.

FIG. 7B is a view showing gas supply timings and a change of an internal temperature of a process chamber in a cleaning process and a purge process according to modification 5.

DETAILED DESCRIPTION

First Embodiment of the Present Disclosure

Figure 1:
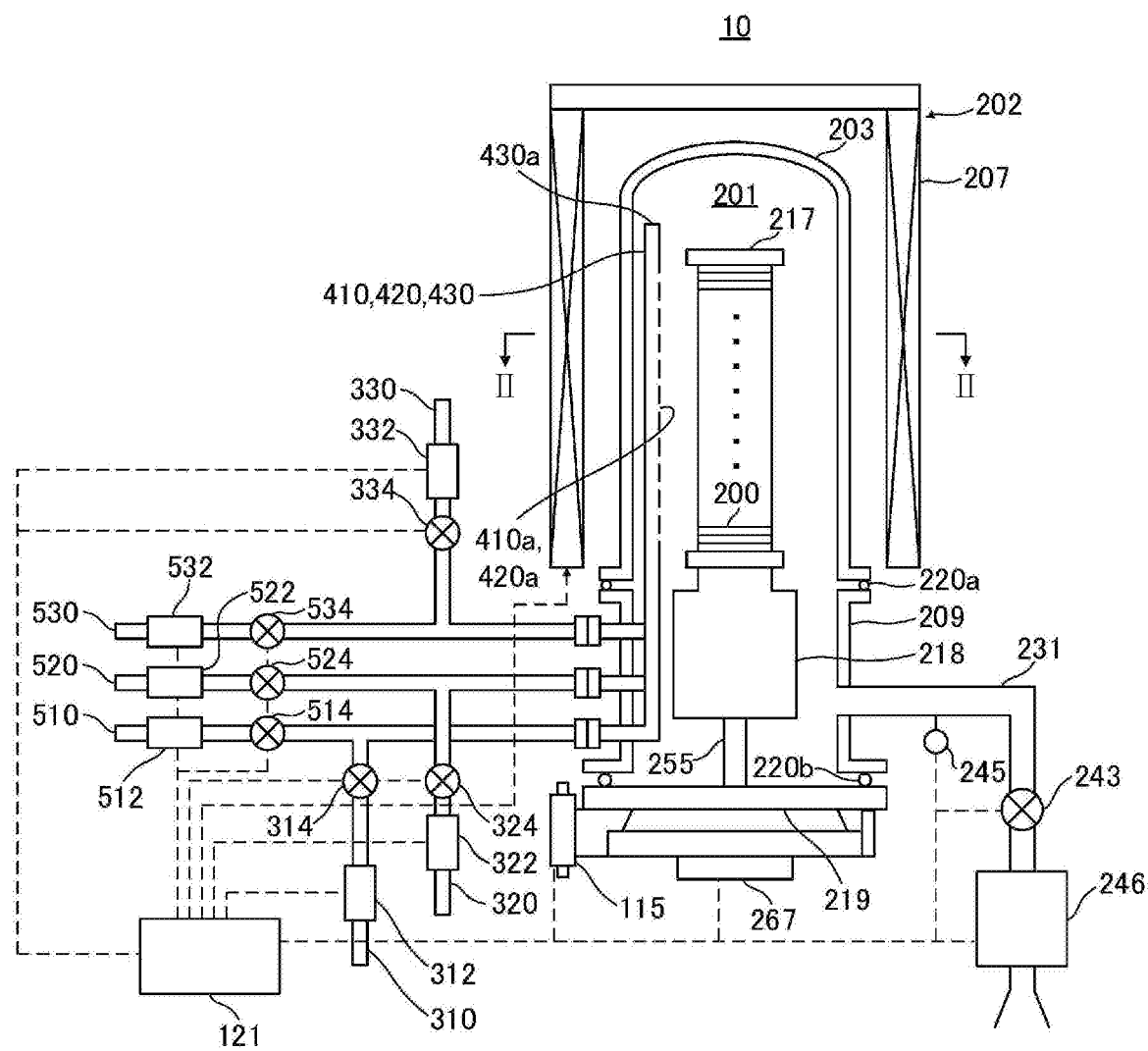
FIG. 1 is a schematic configuration view of a vertical processing furnace of a substrate processing apparatus suitably used in a first embodiment of the present disclosure, in which a portion of the processing furnace is shown in a vertical cross section.
Figure 2:
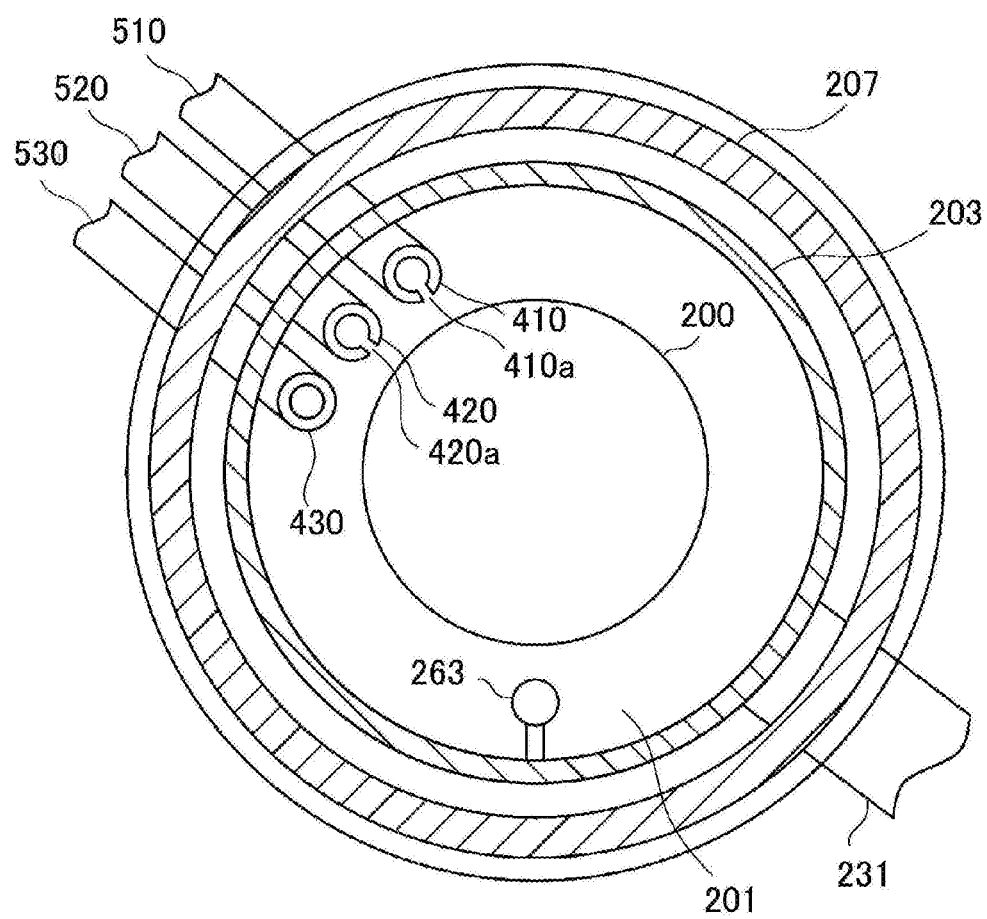
FIG. 2 is a schematic configuration view of the vertical processing furnace of the substrate processing apparatus suitably used in the first embodiment of the present disclosure, in which a portion of the processing furnace is shown in a cross section taken along line II-II in FIG. 1.

A preferred first embodiment of the present disclosure will now be described in detail with reference to FIGS. 1 and 2. A substrate processing apparatus 10 is configured as one example of an apparatus used in a substrate processing process which is one of processes of manufacturing a semiconductor device.

(1) Configuration of Processing Furnace

In a processing furnace 202, there is provided a heater 207 as a heating means (a heating mechanism or a heating system). The heater 207 is of a cylindrical shape and is vertically installed by being supported on a heater base (not shown) as a holding plate.

A reaction tube 203 that constitutes a reaction vessel (a process vessel) is disposed inside the heater 207 in a concentric relationship with the heater 207. The reaction tube 203 is made of a heat resistant material (e.g., quartz ($SiO_2$), silicon carbide (SiC) or the like) and has a cylindrical shape with its upper end closed and its lower end opened. A manifold (inlet flange) 209 is disposed below the reaction tube 203 in a concentric relationship with the reaction tube 203. The manifold 209 is made of metal, e.g., stainless steel (SUS), and has a cylindrical shape with its upper and lower ends opened. The upper end of the manifold 209 engages with the lower end of the reaction tube 203. The manifold 209 is configured to support the reaction tube 203. An O-ring 220a as a seal member is installed between the manifold 209 and the reaction tube 203. The manifold 209 is supported by the heater base. Thus, the reaction tube 203 comes into a vertically mounted state. A processing vessel (reaction vessel) is mainly configured by the reaction tube 203 and the manifold 209. A process chamber 201 is formed in a hollow cylindrical portion of the processing vessel.

The process chamber 201 is configured to accommodate a plurality of wafers 200 as substrates. The wafers 200 are horizontally stacked at multiple stages along a vertical direction in a boat 217 which will be described later.

Nozzles 410, 420 and 430 are installed in the process chamber 201 so as to penetrate through a sidewall of the manifold 209. Gas supply pipes 510, 520 and 530 as gas supply lines are respectively connected to the nozzles 410, 420 and 430. In this way, the three nozzles 410, 420 and 430 and the three gas supply pipes 510, 520 and 530 are installed in the reaction tube 203 and are capable of supplying plural kinds of gases into the process chamber 201. However, the processing furnace 202 of the present embodiment is not limited to the form described above.

Mass flow controllers (MFCs) 512, 522 and 532, which are flow rate controllers (flow rate control parts), and valves 514, 524 and 534, which are opening/closing valves, are installed in the gas supply pipes 510, 520 and 530 sequentially from the corresponding upstream sides. Gas supply pipes 310, 320 and 330, which supply an inert gas, are respectively connected to the gas supply pipes 510, 520 and 530 at the downstream side of the valves 514, 524 and 534. MFCs 312, 322 and 332 and valves 314, 324 and 334, which are opening/closing valves, are installed in the gas supply pipes 310, 320 and 330 sequentially from the corresponding upstream sides.

The nozzles 410, 420 and 430 are connected to end portions of the gas supply pipes 510, 520 and 530. The nozzles 410, 420 and 430 are formed of L-shaped long nozzles with the horizontal portions thereof installed to penetrate through the sidewall of the manifold 209. The vertical portions of the nozzles 410, 420 and 430 are installed in an annular space between the inner wall of the reaction tube 203 and the wafers 200 so as to extend upward (upward in the stacking direction of the wafers 200) along the inner wall of the reaction tube 203 (namely, so as to extend upward from one end side of a wafer arrangement region toward the other end side thereof). That is to say, the nozzles 410, 420 and 430 are installed is a region, which exists at a lateral side of the wafer arrangement region where the wafers 200 are arranged and which horizontally surrounds the wafer arrangement region, so as to extend along the wafer arrangement region.

Gas supply holes 410a and 420a, which supply (inject) gases, are respectively formed on the side surfaces of the nozzles 410 and 420. The gas supply holes 410a and 420a are opened toward the center of the reaction tube 203. The gas supply holes 410a and 420a are installed in a plural number so as to span from the lower portion of the reaction tube 203 to the upper portion thereof. The gas supply holes 410a and 420a have the same opening area and are disposed at the same opening pitch. However, the gas supply holes 410a and 420a are not limited to the form described above. For example, the opening area may be gradually increased from the lower portion of the reaction tube 203 toward the upper portion thereof. In this case, it is possible to make uniform the flow rates of the gases supplied from the gas supply holes 410a and 420a. Gas supply holes, which supply (inject) a gas, are not formed on the side surface of the nozzle 430. A gas supply hole 430a is opened at the vertex of the nozzle 430. That is to say, the nozzle 430 is formed of an open-top (chimney) type nozzle.

In a gas supply method according to the present embodiment, gases are conveyed via the nozzles 410, 420 and 430 disposed within an annular vertically-elongated space, namely a cylindrical space, which is defined by the inner wall of the reaction tube 203 and the end portions of the wafers 200. Then, the gases are injected into the reaction tube 203 from the gas supply holes 410a, 420a and 430a respectively formed in the nozzles 410, 420 and 430. The gases supplied from the nozzles 410 and 420 are initially injected from the gas supply holes 410a and 410b into the reaction tube 203 in the vicinity of the wafers 200. Furthermore, the mainstreams of the gases within the reaction tube 203 are oriented in a direction parallel to the surfaces of the wafers 200, namely in a horizontal direction, by the gas supply holes 410a and 420a formed on the nozzle side surfaces. By employing this configuration, it is possible to evenly supply gases to the respective wafers 200 and to make uniform the film thickness of a film formed on each of the wafers 200. In addition, the gases moved along the surfaces of the respective wafers 200, namely the gases (residual gases) remaining after reaction, flow toward an exhaust port, namely an exhaust pipe 231 which will be described later. The flow direction of the residual gases is appropriately specified by the position of the exhaust port and is not limited to the vertical direction.

As a process gas, a precursor gas which is a gas containing a metal element (a metal-containing gas), is supplied from the gas supply pipe 510 into the process chamber 201 via the MFC 512, the valve 514 and the nozzle 410. For example, a gas of titanium tetrachloride ($TiCl_4$) as a halogen precursor (also referred to as a halide or a halogen-based titanium precursor), which is a titanium-containing precursor (a Ti-containing precursor gas or a Ti-containing gas) containing titanium (Ti) as a metal element, is used as the precursor gas. Ti is classified as a transition metal element. Furthermore, the halogen-based precursor is a precursor containing a halogen group. The halogen group includes a halogen element such as chlorine (Cl), fluorine (F), bromine (Br), iodine (I) or the like. The term "precursor" used herein refers to a "liquid precursor staying in a liquid state", a "precursor gas staying in a gaseous state", or both.

As a process gas, an O-containing gas containing oxygen (O) is supplied from the gas supply pipe 520 into the process chamber 201 via the nozzle 420. As the O-containing gas, it may be possible to use an O-containing gas not containing a metal element, for example, water vapor ($H_2O$ gas). The O-containing gas may be used as a reaction gas which will be described later. Furthermore, the O-containing gas may be used as a below-mentioned purge gas containing hydrogen (H) and O.

As a process gas, a cleaning gas containing a halogen element is supplied from the gas supply pipe 530 into the process chamber 201 via the MFC 532, the valve 534 and the nozzle 430. For example, a chlorine trifluoride ($ClF_3$) gas is used as the cleaning gas containing the halogen element. The cleaning gas will be often referred to as an etching gas.

As an inert gas, for example, a nitrogen ($N_2$) gas is supplied from the gas supply pipes 310, 320 and 330 into the process chamber 201 via the MFCs 312, 322 and 332, the valves 314, 324 and 334 and the nozzles 410, 420 and 430, respectively.

In the case where a compound staying in a liquid state under a room temperature and an atmospheric pressure, such as $TiCl_4$, $H_2O$ or the like, is used as the process gas, $TiCl_4$ or $H_2O$ is vaporized by a vaporization system such as a vaporizer, a bubbler or the like and is supplied into the process chamber 201 as a $TiCl_4$ gas or a $H_2O$ gas. In the case of using the $H_2O$ gas, water vapor ($H_2O$ gas) is generated by supplying an $N_2$ gas to a $H_2O$ tank which stores $H_2O$. Thus, the flow rate of the $H_2O$ gas supplied into the process chamber 201 is controlled by controlling the flow rate of the $N_2$ gas. Furthermore, the vaporization amount of the $H_2O$ gas generated in the bubbler, namely the flow rate of the $H_2O$ gas supplied into the process chamber 201, depends on the temperature of the $H_2O$ tank. For example, as the temperature of the $H_2O$ tank grows higher, the vaporization amount of the $H_2O$ gas becomes larger. As the temperature of the $H_2O$ tank grows lower, the vaporization amount of the $H_2O$ gas becomes smaller.

A process gas supply system is mainly configured by the gas supply pipes 510, 520 and 530, the MFCs 512, 522 and 532 and the valves 514, 524 and 534. The nozzles 410, 420 and 430 may be included in the process gas supply system. The process gas supply system may be simply referred to as a gas supply system.

In the case where a precursor gas is allowed to flow from the gas supply pipe 510, a precursor gas supply system is mainly configured by the gas supply pipe 510, the MFC 512 and the valve 514. The nozzle 410 may be included in the precursor gas supply system. The precursor gas supply system may be referred to as a precursor supply system. In the case where a metal-containing gas as a precursor gas is allowed to flow from the gas supply pipe 510, the precursor gas supply system may be referred to as a metal-containing gas supply system. In the case where a Ti-containing gas is allowed to flow from the gas supply pipe 510, the precursor gas supply system may be referred to as a Ti-containing gas supply system. In the case where a $TiCl_4$ gas is allowed to flow from the gas supply pipe 510, the Ti-containing gas supply system may be referred to as a $TiCl_4$ gas supply system. The $TiCl_4$ gas supply system may be referred to as a $TiCl_4$ supply system.

In the case where an O-containing gas is allowed to flow from the gas supply pipe 520, an O-containing gas supply system is mainly configured by the gas supply pipe 520, the MFC 522 and the valve 524. The nozzle 420 may be included in the O-containing gas supply system. The O-containing gas supply system may be referred to as a reaction gas supply system. In the case where the O-containing gas is used as a purge gas, the O-containing gas supply system may be referred to as an H- and O-containing purge gas supply system or a purge gas supply system. The H- and O-containing purge gas may be referred to as a reactive purge gas. The H- and O-containing purge gas supply system may be referred to as a reactive purge gas supply system. In the case where a $H_2O$ gas is allowed to flow from the gas supply pipe 520, the O-containing gas supply system may be referred to as a $H_2O$ gas supply system.

In the case where a cleaning gas containing a halogen element is allowed to flow from the gas supply pipe 530, a cleaning gas supply system is mainly configured by the gas supply pipe 530, the MFC 532 and the valve 534. The nozzle 430 may be included in the cleaning gas supply system. The cleaning gas supply system may be referred to as an etching gas supply system. In the case where a $ClF_3$ gas is allowed to flow from the gas supply pipe 530, the cleaning gas supply system may be referred to as a $ClF_3$ gas supply system. The $ClF_3$ gas supply system may be referred to as a $ClF_3$ supply system.

Furthermore, an inert gas supply system is mainly configured by the gas supply pipes 310, 320 and 330, the MFCs 312, 322 and 332 and the valves 314, 324 and 334. The inert gas supply system may be referred to as a purge gas supply system, a dilution gas supply system or a carrier gas supply system. The inert gas acting as a purge gas may be referred to as an inert purge gas. The inert gas supply system may be referred to as an inert purge gas supply system.

In the manifold 209, there is provided an exhaust pipe 231 which exhausts the internal atmosphere of the process chamber 201. A pressure sensor 245 as a pressure detector (pressure detection part) which detects the internal pressure of the process chamber 201, an auto pressure controller (APC) valve 243 and a vacuum pump 246 as a vacuum exhaust device are connected to the exhaust pipe 231 sequentially from the upstream side of the exhaust pipe 231. The APC valve 243 is a valve configured so that the vacuum exhaust of the interior of the process chamber 201 and the vacuum exhaust stop can be performed by opening and closing the APC valve 243 while operating the vacuum pump 246 and so that the internal pressure of the process chamber 201 can be adjusted by adjusting the opening degree of the APC valve 243 while operating the vacuum pump 246. An exhaust system, namely an exhaust line, is mainly configured by the exhaust pipe 231, the APC valve 243 and the pressure sensor 245. The vacuum pump 246 may be included in the exhaust system.

The APC valve 243 constitutes a portion of an exhaust flow path of the exhaust system. The APC valve 243 functions not only as a pressure regulation part but also as an exhaust flow path opening/closing part, namely an exhaust valve, which is capable of closing, ultimately sealing the exhaust flow path of the exhaust system. That is to say, the exhaust system is configured so that the "actual internal pressure" of the process chamber 201 can be brought close to a predetermined "set pressure" by adjusting the opening degree of the APC valve 243 based on the pressure information detected by the pressure sensor 245, while operating the vacuum pump 246. For example, in order to change the actual internal pressure of the process chamber 201 in the case where the flow rate of the gas supplied into the process chamber 201 shows no change or in the case where the supply of the gas into the process chamber 201 is stopped, the set pressure of the interior of the process chamber 201 is changed and the opening degree of the APC valve 243 is changed to an opening degree corresponding to the aforementioned set pressure. As a result, the exhaust capacity of the exhaust line is changed and the actual internal pressure of the process chamber 201 is gradually (curvilinearly) brought close to the aforementioned set pressure. The "set pressure" of the interior of the process chamber 201 may be considered to be synonymous with a "target pressure" used when controlling the internal pressure of the process chamber 201. The "actual internal pressure" of the process chamber 201 follows the value of the set pressure. Furthermore, the expression "the set pressure of the interior of the process chamber 201 is changed" is substantially synonymous with the expression "the opening degree of the APC valve 243 is changed in order to change the exhaust capacity of the exhaust line" and may be regarded as "a command for changing the opening degree of the APC valve 243".

A seal cap 219, which serves as a furnace opening cover capable of hermetically sealing a lower end opening of the manifold 209, is installed under the manifold 209. The seal cap 219 is configured to make contact with the lower end of the manifold 209 at a lower side in the vertical direction. The seal cap 219 is made of metal such as, e.g., stainless steel or the like, and is formed in a disc shape. An O-ring 220b, which is a seal member making contact with the lower end portion of the manifold 209, is installed on an upper surface of the seal cap 219. A rotation mechanism 267 configured to rotate the boat 217 which will be described later is installed at the opposite side of the seal cap 219 from the process chamber 201. A rotary shaft 255 of the rotation mechanism 267, which penetrates through the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism vertically installed outside the reaction tube 203. The boat elevator 115 is configured to load and unload the boat 217 into and from the process chamber 201 by moving the seal cap 219 up and down. The boat elevator 115 is configured as a transfer device (transfer mechanism) which transfers the boat 217, i.e., the wafers 200, into and out of the process chamber 201.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. That is to say, the boat 217 is configured to arrange the wafers 200 in a spaced-apart relationship. The boat 217 is made of a heat resistant material such as quartz or SiC. Heat insulating plates 218 made of a heat resistant material such as quartz or SiC are installed below the boat 217 in a horizontal posture and in multiple stages. With this configuration, it is hard for heat generated from the heater 207 to be transferred to the seal cap 219. However, the present embodiment is not limited to the above-described configuration. For example, instead of installing the heat insulating plates 218 below the boat 217, a heat insulating tube as a tubular member made of a heat resistant material such as quartz or SiC may be installed below the boat 217.

A temperature sensor 263 serving as a temperature detector is installed in the reaction tube 203. Based on the temperature information detected by the temperature sensor 263, an amount of electric power supplied to the heater 207 is adjusted such that the interior of the process chamber 201 has a desired temperature distribution. Similar to the nozzles 410, 420 and 430, the temperature sensor 263 is formed in an L-shape. The temperature sensor 263 is installed along the inner wall of the reaction tube 203.

Figure 3:
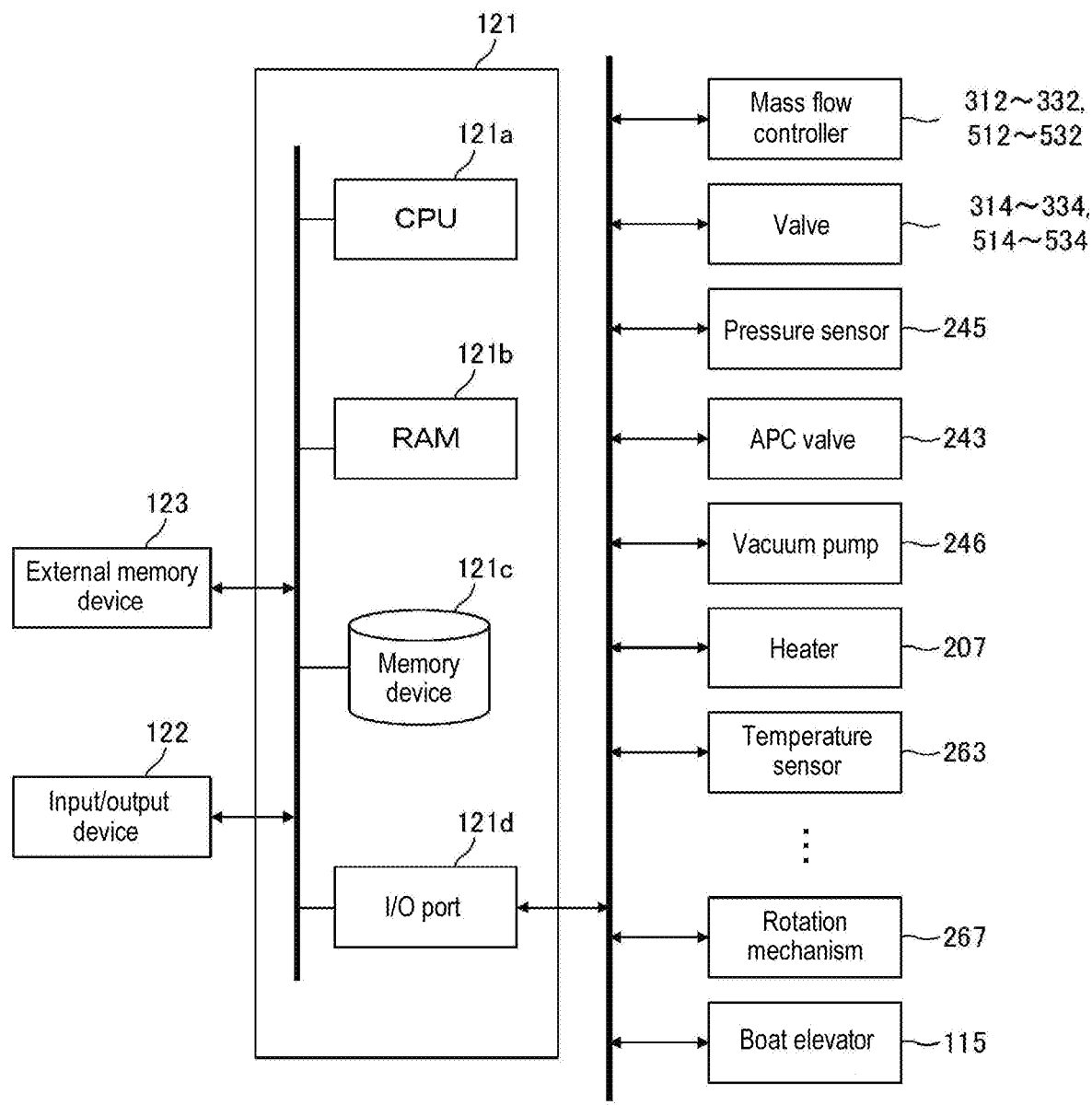
FIG. 3 is a schematic configuration diagram of a controller of the substrate processing apparatus suitably used in the first embodiment of the present disclosure, in which a control system of the controller is shown in a block diagram.

As illustrated in FIG. 3, a controller 121, which is a control part (control means), may be configured as a computer including a central processing unit (CPU) 121a, a random access memory (RAM) 121b, a memory device 121c and an I/O port 121d. The RAM 121b, the memory device 121c and the I/O port 121d are configured to exchange data with the CPU 121a via an internal bus. An input/output device 122 configured with, e.g., a touch panel or the like, is connected to the controller 121.

The memory device 121c is configured with, for example, a flash memory, a hard disc drive (HDD), or the like. A control program for controlling operations of a substrate processing apparatus, a process recipe in which sequences and conditions of a substrate processing process to be described later are written, a cleaning recipe in which sequences and conditions of a cleaning process to be described later are written, a purge recipe in which sequences and conditions of a purge process to be described later are written, or the like, are readably stored in the memory device 121c. The process recipe functions as a program for causing the controller 121 to execute each sequence in the substrate processing process, which will be described later, to obtain a predetermined result. Furthermore, the cleaning recipe functions as a program for causing the controller 121 to execute each sequence in the cleaning process, which will be described later, to obtain a predetermined result. Moreover, the purge recipe functions as a program for causing the controller 121 to execute each sequence in the purge process, which will be described later, to obtain a predetermined result. Hereinafter, the process recipe, the cleaning recipe, the purge recipe, the control program or the like will be generally and simply referred to as a "program". When the term "program" is used herein, it may indicate a case of including only the process recipe, a case of including only the cleaning recipe, a case of including only the purge recipe, a case of including only the control program, or a case of including an arbitrary combination of the process recipe, the cleaning recipe, the purge recipe and the control program. The RAM 121b is configured as a memory area (work area) in which a program or data read by the CPU 121a is temporarily stored.

The I/O port 121d is connected to the MFCs 312, 322, 332, 512, 522 and 532, the valves 314, 324, 334, 514, 524 and 534, the APC valve 243, the pressure sensor 245, the vacuum pump 246, the heater 207, the temperature sensor 263, the rotation mechanism 267, the boat elevator 115 or the like.

The CPU 121a is configured to read the control program from the memory device 121c and to execute the same. The CPU 121a is also configured to read the process recipe, the cleaning recipe, the purge recipe or the like from the memory device 121c according to an input of an operation command from the input/output device 122. Hereinafter, for the sake of convenience, these recipes will be generally and simply referred to as a "recipe". The CPU 121a is configured to control the flow rate adjusting operation of various kinds of gases by the MFCs 312, 322, 332, 512, 522 and 532, the opening/closing operation of the valves 314, 324, 334, 514, 524 and 534, the opening/closing operation of the APC valve 243, the pressure regulating operation performed by the APC valve 243 based on the pressure sensor 245, the temperature adjusting operation performed by the heater 207 based on the temperature sensor 263, the driving and stopping of the vacuum pump 246, the operation of rotating the boat 217 and adjusting the rotation speed of the boat 217 with the rotation mechanism 267, the operation of moving the boat 217 up and down with the boat elevator 115 or the like, according to contents of the read recipe.

The controller 121 may be configured by installing, on the computer, the aforementioned program stored in an external memory device 123 (for example, a magnetic tape, a magnetic disc such as a flexible disc or a hard disc, an optical disc such as a CD or DVD, a magneto-optical disc such as an MO, a semiconductor memory such as a USB memory or a memory card). The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using communication means such as the Internet or a dedicated line, instead of using the external memory device 123.

(2) Film Forming Process

Figure 4:
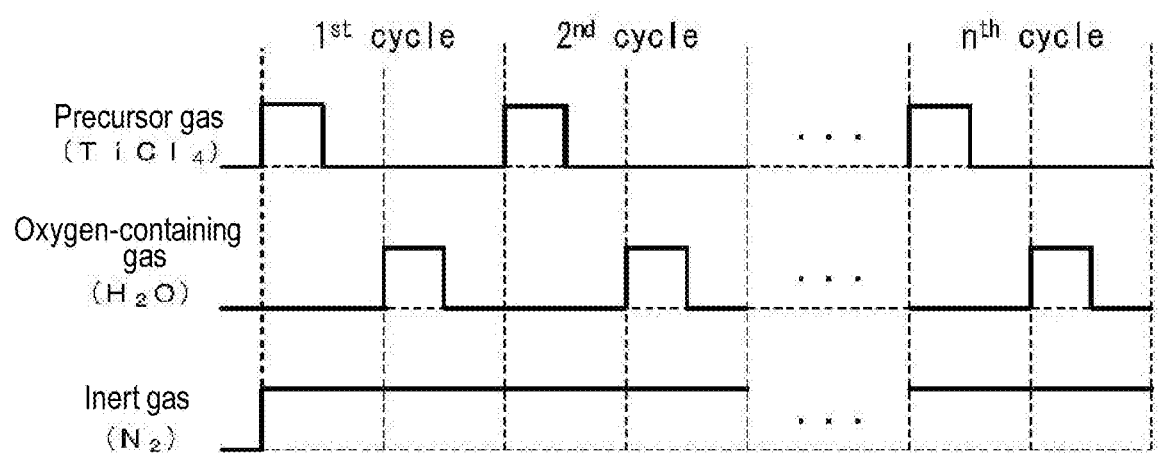
FIG. 4 is a view showing gas supply timings in a film forming process according to the first embodiment of the present disclosure.

A sequence example of a process for forming a film on a substrate using the aforementioned substrate processing apparatus, which is one of the processes for manufacturing a semiconductor device, will be described below with reference to FIG. 4. In the following descriptions, the operations of the respective parts constituting the substrate processing apparatus are controlled by the controller 121.

In the film forming sequence illustrated in FIG. 4, a $TiCl_4$ gas as a precursor gas and a $H_2O$ gas as an O-containing gas are supplied to the wafer 200 as a substrate accommodated within the process chamber 201, thereby forming a titanium oxide film (a $TiO_2$ film) (hereinafter also referred to as a TiO film) as an oxide film on the wafer 200.

When the term "wafer" is used herein, it may refer to "a wafer itself" or "a laminated body (aggregate) of a wafer and a predetermined layer or film formed on the surface of the wafer." That is to say, a wafer including a predetermined layer or film formed on its surface may be referred to as a wafer. In addition, when the phrase "a surface of a wafer" is used herein, it may refer to "a surface (exposed surface) of a wafer itself" or "a surface of a predetermined layer or film formed on a wafer, namely an uppermost surface of the wafer as a laminated body."

Accordingly, in the present disclosure, the expression "a predetermined gas is supplied to a wafer" may mean that "a predetermined gas is directly supplied to a surface (exposed surface) of a wafer itself" or that "a predetermined gas is supplied to a layer or film formed on a wafer, namely to an uppermost surface of a wafer as a laminated body." Furthermore, in the present disclosure, the expression "a predetermined layer (or film) is formed on a wafer" may mean that "a predetermined layer (or film) is directly formed on a surface (exposed surface) of a wafer itself" or that "a predetermined layer (or film) is formed on a layer or film formed on a wafer, namely on an uppermost surface of a wafer as a laminated body."

In addition, when the term "substrate" is used herein, it may be synonymous with the term "wafer."

(Wafer Charging and Boat Loading)

A plurality of wafers 200 is charged on the boat 217 (wafer charging). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the manifold 209 through the O-ring 220b.

(Pressure Regulation and Temperature Adjustment)

The interior of the process chamber 201, namely the space in which the wafers 200 exist, is vacuum-exhausted by the vacuum pump 246 so as to reach a desired pressure (vacuum degree). In this operation, the internal pressure of the process chamber 201 is measured by the pressure sensor 245. The APC valve 243 is feedback-controlled based on the measured pressure information (pressure regulation). The vacuum pump 246 may be continuously activated at least until the processing of the wafers 200 is completed. The interior of the process chamber 201 is heated by the heater 207 to a desired temperature. In this operation, the amount of electric power supplied to the heater 207 is feedback-controlled based on the temperature information detected by the temperature sensor 263 such that the interior of the process chamber 201 has a desired temperature distribution (temperature adjustment). The heating of the interior of the process chamber 201 by the heater 207 may be continuously performed at least until the processing of the wafers 200 is completed. Subsequently, the rotation of the boat 217 and the wafers 200 by the rotation mechanism 267 begins. The rotation of the boat 217 and the wafers 200 by the rotation mechanism 267 may be continuously performed at least until the processing of the wafers 200 is completed.

(TiO Film Forming Step)

Subsequently, a step of forming a TiO film is executed. The TiO film forming step includes a precursor gas supply step, a residual gas removal step, an O-containing gas supply step and a residual gas removal step, all of which will be described below.

(Precursor Gas Supply Step)

The valve 514 is opened and the $TiCl_4$ gas, which is a precursor gas, is allowed to flow through the gas supply pipe 510. The flow rate of the $TiCl_4$ gas flowing through the gas supply pipe 510 is adjusted by the MFC 512. The flow-rate-adjusted $TiCl_4$ gas is supplied from the gas supply holes 410a of the nozzle 410 into the process chamber 201 and is exhausted from the exhaust pipe 231. At this time, the $TiCl_4$ gas is supplied to the wafer 200. That is to say, the surface of the wafer 200 is exposed to the $TiCl_4$ gas. Simultaneously, the valve 314 is opened and an inert gas such as an $N_2$ gas or the like is allowed to flow through the gas supply pipe 310. The flow rate of the $N_2$ gas flowing through the gas supply pipe 310 is adjusted by the MFC 312. The flow-rate-adjusted $N_2$ gas is supplied into the process chamber 201 together with the $TiCl_4$ gas and is exhausted from the exhaust pipe 231. At this time, in order to prevent the $TiCl_4$ gas from entering the nozzles 420 and 430, the valves 324 and 334 are opened and the $N_2$ gas is allowed to flow through the gas supply pipes 320 and 330. The $N_2$ gas is supplied into the process chamber 201 via the gas supply pipe 520, the gas supply pipe 530, the nozzle 420 and the nozzle 430 and is exhausted from the exhaust pipe 231.

At this time, by appropriately adjusting the APC valve 243, the internal pressure of the process chamber 201 is set at, for example, a (predetermined) pressure falling within a range of 1 to 1,000 Pa, specifically a (predetermined) pressure falling within a range of 1 to 100 Pa, more specifically a (predetermined) pressure falling within a range of 10 to 40 Pa. If the internal pressure of the process chamber 201 is higher than 1,000 Pa, there may be a case where the residual gas removal to be described later is not sufficiently performed. If the internal pressure of the process chamber 201 is lower than 1 Pa, there is a possibility that the reaction speed of the $TiCl_4$ gas is not sufficiently obtained. In the present disclosure, the numerical value range of, for example, 1 to 1,000 Pa means 1 Pa or more and 1,000 Pa or less. That is to say, 1 Pa and 1,000 Pa are included in the numerical value range. This holds true with respect to all the numerical values such as a flow rate, a time, a temperature, or the like, which are described herein. The supply flow rate of the $TiCl_4$ gas controlled by the MFC 512 may be set at, for example, a (predetermined) flow rate falling within a range of 1 to 2,000 sccm, specifically a (predetermined) flow rate falling within a range of 10 to 500 sccm, more specifically a (predetermined) flow rate falling within a range of 20 to 150 sccm. If the supply flow rate is higher than 2,000 sccm, there may be a case where the residual gas removal to be described later is not sufficiently performed. If the supply flow rate is lower than 1 sccm, there is a possibility that the reaction speed of the $TiCl_4$ gas is not sufficiently obtained. Each of the supply flow rates of the $N_2$ gas controlled by the MFCs 312, 322 and 332 may be set at, for example, a (predetermined) flow rate falling within a range of 1 to 2,000 sccm, specifically a (predetermined) flow rate falling within a range of 10 to 500 sccm, more specifically a (predetermined) flow rate falling within a range of 30 to 150 sccm. If the supply flow rate of the $N_2$ gas is higher than 2,000 sccm, there is a possibility that the reaction speed of the $TiCl_4$ gas is not sufficiently obtained. If the supply flow rate of the $N_2$ gas is lower than 1 sccm, there may be a case where the residual gas removal to be described later is not sufficiently performed. The supply time period for supplying the $TiCl_4$ gas to the wafer 200, namely the gas supply time period (radiation time period), may be set at, for example, a (predetermined) time period falling within a range of 1 to 60 seconds, specifically a (predetermined) time period falling within a range of 1 to 30 seconds, more specifically a (predetermined) time period falling within a range of 3 to 5 seconds. If the supply time period is longer than 60 seconds, there is possibility that Cl or the like is introduced in a larger amount. If the supply time period is shorter than 1 second, there is a possibility that the deposition rate decreases. At this time, the temperature of the heater 207 may be set at, for example, a temperature at which the temperature of the wafer 200 (the internal temperature of the process chamber 201) becomes a (predetermined) temperature falling within a range of 25 to 130 degrees C., specifically a temperature at which the temperature of the wafer 200 (the internal temperature of the process chamber 201) becomes a (predetermined) temperature falling within a range of 50 to 100 degrees C., more specifically a temperature at which the temperature of the wafer 200 (the internal temperature of the process chamber 201) becomes a (predetermined) temperature falling within a range of 65 to 85 degrees C. At a temperature higher than 130 degrees C., there is a possibility that the pyrolysis of the $TiCl_4$ gas is accelerated. Thus, the deposition rate becomes too high so that the controllability of the film thickness is deteriorated and the uniformity of the film thickness is deteriorated. There may be a case that the impurity is introduced in a larger amount and the resistivity becomes high. On the other hand, at a temperature lower than 25 degrees C., there is a possibility that the reactivity is lowered and the film formation is difficult. The gases flowing into the process chamber 201 are only the $TiCl_4$ gas and the $N_2$ gas. By supplying the $TiCl_4$ gas, a Ti-containing layer having a thickness of, e.g., from less than one atomic layer to several atomic layers, is formed on the wafer 200.

(Residual Gas Removal Step)

After the Ti-containing layer is formed, the valve 514 is closed to stop the supply of the $TiCl_4$ gas. At this time, the interior of the process chamber 201 is vacuum-exhausted by the vacuum pump 246 while opening the APC valve 243 of the exhaust pipe 231. Thus, the unreacted $TiCl_4$ gas or the $TiCl_4$ gas contributed to the formation of the Ti-containing layer, which remains within the process chamber 201, is removed from the interior of the process chamber 201. That is to say, the unreacted $TiCl_4$ gas or the $TiCl_4$ gas contributed to the formation of the Ti-containing layer, which remains in the space where the wafer 200 having the Ti-containing layer formed thereon exists, is removed. At this time, the supply of the $N_2$ gas into the process chamber 201 is maintained while opening the valves 314, 324 and 334. The $N_2$ gas acts as a purge gas and can enhance the effect of removing the unreacted $TiCl_4$ gas or the $TiCl_4$ gas contributed to the formation of the Ti-containing layer, which remains within the process chamber 201, from the interior of the process chamber 201.

At this time, the gas remaining within the process chamber 201 may not be completely removed and the interior of the process chamber 201 may not be completely purged. If the amount of the gas remaining within the process chamber 201 is small, there is no possibility that an adverse effect is generated in the subsequently-performed step. It is not necessary to make large the flow rate of the $N_2$ gas supplied into the process chamber 201. For example, by supplying the $N_2$ gas substantially in the same amount as the volume of the reaction tube 203 (the process chamber 201), it is possible to perform a purge operation such that an adverse effect is not generated in the subsequently-performed step. By not completely purging the interior of the process chamber 201, it is possible to shorten the purge time period and to improve the throughput. In addition, it is possible to suppress the consumption of the $N_2$ gas to a necessary minimum level.

(O-Containing Gas Supply Step)

After the gas remaining within the process chamber 201 is removed, the valve 524 is opened and a $H_2O$ gas, which is an O-containing gas, is allowed to flow through the gas supply pipe 520. The flow rate of the $H_2O$ gas flowing through the gas supply pipe 520 is adjusted by the MFC 522. The flow-rate-adjusted $H_2O$ gas is supplied from the gas supply holes 420a of the nozzle 420 into the process chamber 201. The $H_2O$ gas supplied into the process chamber 201 is exhausted from the exhaust pipe 231. At this time, the $H_2O$ gas is supplied to the wafer 200. That is to say, the surface of the wafer 200 is exposed to the $H_2O$ gas. Simultaneously, the valve 324 is opened and the $N_2$ gas is allowed to flow through the gas supply pipe 320. The flow rate of the $N_2$ gas flowing through the gas supply pipe 320 is adjusted by the MFC 322. The $N_2$ gas is supplied into the process chamber 201 together with the $H_2O$ gas and is exhausted from the exhaust pipe 231. At this time, in order to prevent the $H_2O$ gas from entering the nozzles 410 and 430, the valves 314 and 334 are opened and the $N_2$ gas is allowed to flow through the gas supply pipes 310 and 330. The $N_2$ gas is supplied into the process chamber 201 via the gas supply pipes 510 and 530 and the nozzles 410 and 430 and is exhausted from the exhaust pipe 231.

By appropriately adjusting the APC valve 243 when the $H_2O$ gas is allowed to flow, the internal pressure of the process chamber 201 is set at, for example, a (predetermined) pressure falling within a range of 1 to 1,000 Pa, specifically a (predetermined) pressure falling within a range of 10 to 300 Pa, more specifically a (predetermined) pressure falling within a range of 35 to 55 Pa. If the internal pressure of the process chamber 201 is higher than 1,000 Pa, there may be a case where the residual gas removal to be described later is not sufficiently performed. If the internal pressure of the process chamber 201 is lower than 1 Pa, there is a possibility that the sufficient deposition rate is not obtained. The supply flow rate of the $N_2$ gas supplied to the $H_2O$ tank, which is controlled by the MFC 522, may be set at, for example, a (predetermined) flow rate falling within a range of 1,000 to 80,000 sccm, specifically a (predetermined) flow rate falling within a range of 1,000 to 40,000 sccm, more specifically a (predetermined) flow rate falling within a range of 1,000 to 2,000 sccm. As the supply flow rate of the $N_2$ gas grows higher, the vaporization amount of $H_2O$, namely the flow rate of the $H_2O$ gas, becomes larger. This is desirable because it is possible to suppress the introduction of an impurity originating from the precursor gas into a TiO film. However, if the supply flow rate of the $N_2$ gas is higher than 80,000 sccm, there is a possibility that the residual gas cannot be sufficiently removed in the residual gas removal step which will be described later. If the supply flow rate of the $N_2$ gas is lower than 1,000 sccm, there is a possibility that the vaporization amount of $H_2O$, namely the flow rate of the $H_2O$ gas, becomes smaller and the reaction cannot sufficiently occur. The temperature of the $H_2O$ tank may be set at, for example, a (predetermined) temperature falling within a range of 20 to 50 degrees C., specifically a (predetermined) temperature falling within a range of 20 to 30 degrees C., more specifically a (predetermined) temperature falling within a range of 27 to 30 degrees C. If the temperature of the $H_2O$ tank is higher than 50 degrees C., there is a possibility that the vaporization amount of the $H_2O$ gas becomes too large. If the temperature of the $H_2O$ tank is lower than 20 degrees C., there is a possibility that the vaporization amount of the $H_2O$ gas is not sufficiently obtained. The supply flow rate of the $N_2$ gas controlled by the MFCs 312, 322 and 332 may be set at, for example, a (predetermined) flow rate falling within a range of 200 to 40,000 sccm, specifically a (predetermined) flow rate falling within a range of 4,000 to 8,000 sccm, more specifically a (predetermined) flow rate falling within a range of 5,000 to 6,000 sccm. If the supply flow rate of the $N_2$ gas is higher than 40,000 sccm, there is a possibility that the deposition rate becomes too low. If the supply flow rate of the $N_2$ gas is lower than 200 sccm, there is a possibility that the $H_2O$ gas is not sufficiently supplied to the wafer 200. The supply time period for supplying the $H_2O$ gas to the wafer 200, namely the gas supply time period (radiation time period), may be set at, for example, a (predetermined) time period falling within a range of 1 to 60 seconds, specifically a (predetermined) time period falling within a range of 1 to 30 seconds, more specifically a (predetermined) time period falling within a range of 5 to 15 seconds. It is preferred that the supply time period is set longer. By doing so, it is possible to suppress the introduction of an impurity originating from the precursor gas into a TiO film. However, if the supply time period is longer than 60 seconds, there is a possibility that the throughput is deteriorated. If the supply time period is shorter than 1 second, there is a possibility that the $H_2O$ gas cannot sufficiently react with the $TiCl_4$ gas. At this time, the temperature of the heater 207 may be set at the same temperature as that of the precursor gas supply step.

The gases flowing into the process chamber 201 at this time are only the $H_2O$ gas and the $N_2$ gas. The $H_2O$ gas makes substitution reaction with at least a portion of the Ti-containing layer formed on the wafer 200 at the precursor gas supply step. During the substitution reaction, Ti contained in the Ti-containing layer and O contained in the $H_2O$ gas are bonded to each other, whereby a TiO layer containing Ti and O is formed on the wafer 200.

(Residual Gas Removal Step)

After the TiO layer is formed, the valve 524 is closed to stop the supply of the $H_2O$ gas. At this time, the interior of the process chamber 201 is vacuum-exhausted by the vacuum pump 246 while opening the APC valve 243 of the exhaust pipe 231. Thus, the unreacted $H_2O$ gas, the $H_2O$ gas contributed to the formation of the TiO layer, or the reaction byproduct, which remains within the process chamber 201, is removed from the interior of the process chamber 201. At this time, the supply of the $N_2$ gas into the process chamber 201 is maintained while opening the valves 314, 324 and 334. The $N_2$ gas acts as a purge gas and can enhance the effect of removing the unreacted $H_2O$ gas, the $H_2O$ gas contributed to the formation of the TiO layer, or the reaction byproduct, which remains within the process chamber 201, from the interior of the process chamber 201.

At this time, similar to the residual gas removal step performed after the precursor gas supply step, the gas remaining within the process chamber 201 may not be completely removed and the interior of the process chamber 201 may not be completely purged.

(Performing a Predetermined Number of Times)

A TiO film having a predetermined thickness is formed on the wafer 200 by performing, once or more (a predetermined number of times), a cycle which sequentially and time-divisionally performs the precursor gas supply step, the residual gas removal step, the O-containing gas supply step and the residual gas removal step, namely by executing one cycle of processing of the precursor gas supply step, the residual gas removal step, the O-containing gas supply step and the residual gas removal step by n cycles (where n is an integer of 1 or more). In the present disclosure, the expression "performing, a predetermined number of times, a processing (also referred to as a process, a cycle or a step)" means that the processing or the like is performed once or multiple times, namely that the processing is performed once or more. FIG. 4 illustrates an example in which each processing (cycle) is repeated by n cycles. The value of n is properly selected depending on the film thickness required in the finally-formed TiO film. That is to say, the number of times of performing each processing described above is decided depending on a target film thickness. It is preferred that the aforementioned cycle is repeated multiple times. Furthermore, the thickness of the TiO film may be set at, for example, 10 to 150 nm, specifically 50 to 120 nm, more specifically 70 to 90 nm. If the thickness of the TiO film (the film thickness) is larger than 150 nm, there is a possibility that the roughness increases. If the film thickness is smaller than 10 nm, there is a possibility that film separation occurs due to a difference in stress between the TiO film and the base film.

The descriptive part which recites that "a gas is supplied to the wafer 200" at each step after at least the second cycle in the case where the cycle is performed a predetermined number of times means that "a specified gas is supplied to the layer formed on the wafer 200, namely to the uppermost surface of the wafer 200 as a laminated body". The descriptive part which recites that "a specified layer is formed on the wafer 200" at each step after at least the second cycle in the case where the cycle is performed a predetermined number of times means that "a specified layer is formed on the layer formed on the wafer 200, namely on the uppermost surface of the wafer 200 as a laminated body". This holds true in the examples which will be described later.

(Purge and Return to Atmospheric Pressure)

The valves 314, 324 and 334 are opened. The $N_2$ gas is supplied from the gas supply pipes 310, 320 and 330 into the process chamber 201 and is exhausted from the exhaust pipe 231. The $N_2$ gas acts as a purge gas. Thus, the interior of the process chamber 201 is purged by an inert gas. The gas or the byproduct remaining within the process chamber 201 is removed from the interior of the process chamber 201 (purge). Thereafter, the internal atmosphere of the process chamber 201 is substituted by the inert gas (inert gas substitution). The internal pressure of the process chamber 201 is returned to an atmospheric pressure (return to atmospheric pressure).

(Boat Unloading and Wafer Discharging)

Thereafter, the seal cap 219 is moved down by the boat elevator 115 and the lower end of the manifold 209 is opened. Then, the processed wafers 200 supported on the boat 217 are unloaded from the lower end of the manifold 209 to the outside of the reaction tube 203 (boat unloading). Thereafter, the processed wafers 200 are discharged from the boat 217 (wafer discharging).

(3) Cleaning Process

If the aforementioned film forming process is performed, deposits including a thin film such as a TiO film or the like are accumulated on the inner wall of the reaction tube 203, the surfaces of the nozzles 410, 420 and 430, the inner wall of the manifold 209, the surface of the boat 217, the upper surface of the seal cap 219, the heat insulating plates 218, or the like. That is to say, an O-containing deposit (oxide film) is attached to and accumulated on the surfaces of the members exiting within the heated process chamber 201. Accordingly, a cleaning process is performed before the amount of the deposit (the thickness of the deposit), namely the accumulated film thickness, reaches a predetermined amount (thickness) at which the deposit is separated or dropped.

One example of the cleaning process according to the present disclosure will now be described with reference to FIG. 5A. The former half ($ClF_3$ Etching and $N_2$ Purge) in FIG. 5A corresponds to the cleaning process. Only the $ClF_3$ etching may be referred to as a cleaning process. In the following descriptions, the operations of the respective parts constituting the substrate processing apparatus are controlled by the controller 121.

In the cleaning process illustrated in FIG. 5A, a $ClF_3$ gas as a cleaning gas containing a halogen element is supplied into the process chamber 201 to remove an O-containing deposit (oxide film) adhering to the members disposed within the process chamber 201. In this regard, a step of removing the O-containing deposit (oxide film) is performed under a temperature higher than the temperature used at the step of forming the TiO film (oxide film) in the film forming process.

(Boat Loading)

An empty boat 217, namely a boat 217 not charged with the wafers 200, is lifted up by the boat elevator 115 and is loaded into the process chamber 201. In this state, the seal cap 219 seals the lower end of the manifold 209 through the O-ring 220b.

(Pressure Regulation and Temperature Adjustment)

The interior of the process chamber 201 is vacuum-exhausted by the vacuum pump 246 so that the internal pressure of the process chamber 201 becomes a predetermined etching pressure which will be described later. The vacuum pump 246 is always kept actuated at least until a $H_2O$ cycle purge step of a purge process to be described later is completed. Furthermore, the interior of the process chamber 201 is heated by the heater 207 so that the internal temperature of the process chamber 201 becomes a predetermined etching temperature which will be described later. Moreover, the rotation of the boat 217 by the rotation mechanism 267 begins. The rotation of the boat 217 is continuously performed at least until the $H_2O$ cycle purge step is completed. Alternatively, the boat 217 may not be rotated.

($ClF_3$ Etching Step)

At this step, a $ClF_3$ gas is supplied into the process chamber 201 which has performed the process of forming the TiO film on the wafer 200, namely the process chamber 201 to which a deposit including an O-containing film adheres.

The valve 534 is opened and the $ClF_3$ gas is allowed to flow through the gas supply pipe 530. The flow rate of the $ClF_3$ gas is adjusted by the MFC 532. The $ClF_3$ gas is supplied into the process chamber 201 via the gas supply pipe 530 and the nozzle 430. At this time, the valve 334 may be opened and the $N_2$ gas may be allowed to flow through the gas supply pipe 330 so as to dilute the $ClF_3$ gas within the gas supply pipe 530. By controlling the supply flow rate of the $N_2$ gas, it is possible to control the concentration of the $ClF_3$ gas supplied into the process chamber 201. Furthermore, in order to prevent the $ClF_3$ gas from entering the nozzles 410 and 420, the valves 314 and 324 are opened and the $N_2$ gas is allowed to flow through the gas supply pipes 310 and 320. The $N_2$ gas is supplied into the process chamber 201 via the gas supply pipes 510 and 520 and the nozzles 410 and 420 and is exhausted from the exhaust pipe 231.

When moved through the interior of the process chamber 201 and exhausted from the exhaust pipe 231, the $ClF_3$ gas supplied into the process chamber 201 makes contact with the surfaces of the members disposed within the process chamber 201, for example, the inner wall of the reaction tube 203, the surfaces of the nozzles 410, 420 and 430, the inner wall of the manifold 209, the surface of the boat 217, the upper surface of the seal cap 219, the heat insulating plates 218 or the like. At this time, the deposit (oxide film) including an O-containing film, which adheres to the members disposed within the process chamber 201, is removed by thermochemical reaction. That is to say, the deposit is removed by the etching reaction between $ClF_3$ and the deposit. During the course of the etching reaction, Ti contained in the deposit and F contained in $ClF_3$ are bonded to each other, whereby $TiF_4$ or the like is generated within the process chamber 201. As described above, by supplying the $ClF_3$ gas into the process chamber 201 to which the deposit including an O-containing film adheres, it is possible to induce the etching reaction of the aforementioned deposit under a non-plasma atmosphere.

At this time, by appropriately adjusting the APC valve 243, the internal pressure of the process chamber 201 is set at, for example, a (predetermined) pressure (etching pressure) falling within a range of 1 to 20,000 Pa, specifically a (predetermined) pressure falling within a range of 10 to 15,000 Pa, more specifically a (predetermined) pressure falling within a range of 13,000 to 14,000 Pa. If the internal pressure of the process chamber 201 is higher than 20,000 Pa, there may be a case where the residual gas removal to be described later is not sufficiently performed. If the internal pressure of the process chamber 201 is lower than 1 Pa, there is a possibility that the etching reaction speed is not sufficiently obtained. The supply flow rate of the $ClF_3$ gas controlled by the MFC 532 may be set at, for example, a (predetermined) flow rate falling within a range of 200 to 2,000 sccm, specifically a (predetermined) flow rate falling within a range of 800 to 1,200 sccm, more specifically a (predetermined) flow rate falling within a range of 900 to 1,100 sccm. If the supply flow rate of the $ClF_3$ gas is higher than 2,000 sccm, there may be a case where the residual gas removal to be described later is not sufficiently performed. If the supply flow rate of the $ClF_3$ gas is lower than 200 sccm, there is a possibility that the etching reaction speed is not sufficiently obtained. Each of the supply flow rates of the $N_2$ gas controlled by the MFCs 312, 322 and 332 may be set at, for example, a (predetermined) flow rate falling within a range of 200 to 40,000 sccm, specifically a (predetermined) flow rate falling within a range of 1,000 to 40,000 sccm, more specifically a (predetermined) flow rate falling within a range of 5,000 to 15,000 sccm. If the supply flow rate of the $N_2$ gas is higher than 40,000 sccm, there is a possibility that the reaction speed of the $ClF_3$ gas is not sufficiently obtained. If the supply flow rate of the $N_2$ gas is lower than 200 sccm, there may be a case where the residual gas removal to be described later is not sufficiently performed. The supply time period for supplying the $ClF_3$ gas to the wafer 200, namely the gas supply time period (etching time period), may be set at, for example, a (predetermined) time period falling within a range of 1 to 3,600 seconds, specifically a (predetermined) time period falling within a range of 1 to 1,800 seconds, more specifically a (predetermined) time period falling within a range of 1,000 to 1,400 seconds. If the supply time period is longer than 3,600 seconds, there is possibility that the residual gas removal to be described later is not sufficiently performed. If the supply time period is shorter than 1 second, there is a possibility that the reaction speed of the $ClF_3$ gas is not sufficiently obtained. At this time, the temperature of the heater 207 may be set at, for example, a (predetermined) temperature (etching temperature) at which the internal temperature of the process chamber 201 falls within a range of 100 to 400 degrees C., specifically a (predetermined) temperature at which the internal temperature of the process chamber 201 falls within a range of 200 to 360 degrees C., more specifically a (predetermined) temperature at which the internal temperature of the process chamber 201 falls within a range of 290 to 350 degrees C. At a temperature higher than 400 degrees C., there may be case where the pyrolysis of the $ClF_3$ gas is accelerated and the etching rate becomes too high. On the other hand, at a temperature lower than 100 degrees C., there is a possibility that the etching reactivity is lowered and the etching is difficult.

The process temperature at the $ClF_3$ etching step of the cleaning process is higher than the process temperature at the precursor gas supply step and the O-containing gas supply step of the film forming process.

(Residual Gas Removal Step)

After the $ClF_3$ gas is supplied for a predetermined time period, the valve 534 is closed to stop the supply of the $ClF_3$ gas. At this time, the interior of the process chamber 201 is vacuum-exhausted by the vacuum pump 246 while opening the APC valve 243 of the exhaust pipe 231. Thus, the unreacted $ClF_3$ gas or the $ClF_3$ gas contributed to the etching reaction of the deposit, which remains within the process chamber 201, is removed from the interior of the process chamber 201. At this time, the supply of the $N_2$ gas into the process chamber 201 is maintained while opening the valves 314, 324 and 334. The $N_2$ gas acts as a purge gas and can enhance the effect of removing the unreacted $ClF_3$ gas or the $ClF_3$ gas contributed to the etching reaction of the deposit, which remains within the process chamber 201, from the interior of the process chamber 201.

(4) Purge Process

If the aforementioned cleaning process is performed, namely if the $ClF_3$ etching step is performed, $TiF_4$ or the like is generated within the process chamber 201 as described above. That is to say, an F component remains as $TiF_4$ or the like. The residual F component becomes a main cause of infiltration of the F component into the TiO film when the film forming process of the TiO film is performed later. Thus, in the present embodiment, subsequent to the cleaning process, a purge process is performed to remove the residual F component, namely the halogen element remaining within the process chamber 201 when the cleaning gas is supplied into the process chamber 201 (the residual halogen element originating from the cleaning gas), from the interior of the process chamber 201.

One example of the purge process according to the present disclosure will now be described with reference to FIG. 5A. The latter half ($H_2O$ Cycle Purge) in FIG. 5A corresponds to the purge process. In the following descriptions, the operations of the respective parts constituting the substrate processing apparatus are controlled by the controller 121.

The purge process illustrated in FIG. 5A includes: a step of supplying and exhausting, under a first process condition (processing condition), a $H_2O$ gas as a purge gas containing H and O into and from the process chamber 201 from which the O-containing deposit (oxide film) adhering to the inertial members has been removed by the $ClF_3$ gas as the cleaning gas containing the halogen element in the cleaning process; and a step of supplying and exhausting, under a second process condition (processing condition) differing from the first process condition, the $H_2O$ gas into and from the process chamber 201 after the step of supplying and exhausting the $H_2O$ gas under the first process condition.

In this regard, the first process condition is a process condition under which the reactivity of the residual F component and the $H_2O$ gas is higher than that of the second process condition.

($H_2O$ Cycle Purge Step)

At this step, the F component remaining within the process chamber 201 is removed from the interior of the process chamber 201 by alternately repeating a step of purging the interior of the process chamber 201 with a $H_2O$ gas as a gas containing H and O ($H_2O$ purge step), a step of purging the interior of the process chamber 201 with an $N_2$ gas as an inert gas ($N_2$ purge step), and a step of depressurizing and exhausting the interior of the process chamber 201 (vacuum step). In the present disclosure, the act of alternately repeating the $H_2O$ purge step, the $N_2$ purge step and the vacuum step, namely the act of performing the $H_2O$ purge step, the $N_2$ purge step and the vacuum step multiple times, is also referred to as a cycle purge or a cyclic purge.

At the $H_2O$ purge step, the exhaust of the interior of the process chamber 201 by the vacuum pump 246 is performed in a state in which the supply of the $H_2O$ gas and the $N_2$ gas into the process chamber 201 has been executed. That is to say, the $H_2O$ gas is supplied by opening the valve 524. The $N_2$ gas is supplied by opening at least one of the valves 314, 324 and 334, preferably all the valves 314, 324 and 334. The exhaust of the interior of the process chamber 201 is performed by opening the APC valve 243.

At the $H_2O$ purge step, the $H_2O$ gas acts as a reactive purge gas which reacts with the residual F component contained in the $TiF_4$ or the like and which removes the residual F component from the interior of the process chamber 201. For example, F contained in the $TiF_4$ or the like and H contained in H$_2$O are bonded to each other, whereby the residual F component becomes HF and is removed. That is to say, the residual halogen element originating from the cleaning gas containing a halogen element and H contained in the purge gas containing H and O are bonded to each other, whereby the residual halogen element becomes hydrogen halide and is removed. In addition, the N$_2$ gas acts as an inert purge gas.

At this time, the supply flow rate of the H$_2$O gas controlled by the MFC 522 may be set at, for example, a (predetermined) flow rate falling within a range of 1,000 to 80,000 sccm, specifically a (predetermined) flow rate falling within a range of 1,000 to 40,000 sccm, more specifically a (predetermined) flow rate falling within a range of 1,000 to 2,000 sccm. The supply flow rate of the N$_2$ gas supplied to the H$_2$O tank, which is controlled by the MFC 522, may be set at, for example, a (predetermined) flow rate falling within a range of 1,000 to 80,000 sccm, specifically a (predetermined) flow rate falling within a range of 1,000 to 40,000 sccm, more specifically a (predetermined) flow rate falling within a range of 1,000 to 2,000 sccm. If the supply flow rate is higher than 80,000 sccm, there may be a case where the residual gas removal to be described later is not sufficiently performed. If the supply flow rate is lower than 1,000 sccm, there is a possibility that the vaporization amount of H$_2$O, namely the flow rate of the H$_2$O gas, is reduced and the reaction speed of the H$_2$O gas is not sufficiently obtained. The temperature of the H$_2$O tank may be set at, for example, a (predetermined) temperature falling within a range of 20 to 50 degrees C., specifically a (predetermined) temperature falling within a range of 20 to 30 degrees C., more specifically a (predetermined) temperature falling within a range of 27 to 30 degrees C. If the temperature of the H$_2$O tank is higher than 50 degrees C., there is a possibility that the vaporization amount of the H$_2$O gas becomes too large. If the temperature of the H$_2$O tank is lower than 20 degrees C., there is a possibility that the vaporization amount of the H$_2$O gas is not sufficiently obtained. Furthermore, the supply flow rate of the N$_2$ gas controlled by the MFCs 312, 322 and 332 may be set at, for example, a (predetermined) flow rate falling within a range of 200 to 40,000 sccm, specifically a (predetermined) flow rate falling within a range of 4,000 to 8,000 sccm, more specifically a (predetermined) flow rate falling within a range of 5,000 to 6,000 sccm. If the supply flow rate of the N$_2$ gas is higher than 40,000 sccm, there is a possibility that the reaction speed of the H$_2$O gas is not sufficiently obtained. If the supply flow rate of the N$_2$ gas is lower than 200 sccm, there may be a case where the residual gas removal to be described later is not sufficiently performed. The opening degree of the APC valve 243 may be complete opening. Alternatively, the opening degree of the APC valve 243 may be feedback-controlled so that the internal pressure of the process chamber 201 is kept constant. The execution time period of the H$_2$O purge step may be set at, for example, a (predetermined) time period falling within a range of 1 to 60 seconds, specifically a (predetermined) time period falling within a range of 1 to 30 seconds, more specifically a (predetermined) time period falling within a range of 5 to 15 seconds. If the execution time period is longer than 60 seconds, there may be a case where the residual gas removal to be described later is not sufficiently performed. If the execution time period is shorter than 1 second, there is a possibility that the reaction of the H$_2$O gas is not sufficiently obtained.

In addition, at the H$_2$O purge step, the simultaneous supply of the N$_2$ gas may not be performed.

At the N$_2$ purge step, the exhaust of the interior of the process chamber 201 by the vacuum pump 246 is performed in a state in which the supply of the H$_2$O gas into the process chamber 201 is stopped and in a state in which the supply of the N$_2$ gas is executed. That is to say, the exhaust of the interior of the process chamber 201 is performed by opening the APC valve 243 in a state in which the valve 524 is closed and in a state in which at least one of the valves 314, 324 and 334, preferably all the valves 314, 324 and 334, is opened.

At the N$_2$ purge step, the N$_2$ gas acts as an inert purge gas. At this time, each of the supply flow rates of the N$_2$ gas controlled by the MFCs 312, 322 and 332 may be set at, for example, a (predetermined) flow rate falling within a range of 200 to 40,000 sccm, specifically a (predetermined) flow rate falling within a range of 10,000 to 20,000 sccm, more specifically a (predetermined) flow rate falling within a range of 13,000 to 17,000 sccm. The higher the supply flow rate, the better. In the meantime, if the supply flow rate is lower than 200 sccm, there may be a case where the residual gas removal is not sufficiently performed and the purge becomes incomplete. The opening degree of the APC valve 243 may be complete opening. Alternatively, the opening degree of the APC valve 243 may be feedback-controlled so that the internal pressure of the process chamber 201 is kept constant. The execution time period of the N$_2$ purge step may be set at, for example, a (predetermined) time period falling within a range of 1 to 60 seconds, specifically a (predetermined) time period falling within a range of 3 to 30 seconds, more specifically a (predetermined) time period falling within a range of 8 to 12 seconds. The longer the execution time period, the better. In the meantime, if the execution time period is shorter than 1 second, there may be a case where the residual gas removal is not sufficiently performed and the purge becomes incomplete.

At the vacuum step, the exhaust of the interior of the process chamber 201 by the vacuum pump 246 (also referred to as depressurization exhaust or vacuum exhaust) is performed in a state in which the supply of the H$_2$O gas and the N$_2$ gas into the process chamber 201 is stopped. That is to say, the exhaust of the interior of the process chamber 201 is performed by opening the APC valve 243 in a state in which the valve 524 is closed and in a state in which the valves 314, 324 and 334 are closed. The vacuum exhaust performed in this way is also referred to as vacuum drawing. At this time, it is desirable that the APC valve 243 is fully opened, namely that the opening degree of the APC valve 243 is complete opening. The execution time period of the vacuum step may be set at, for example, a (predetermined) time period falling within a range of 1 to 60 seconds, specifically a (predetermined) time period falling within a range of 3 to 30 seconds, more specifically a (predetermined) time period falling within a range of 8 to 12 seconds. The longer the execution time period, the better. This is because the residual gas removal is sufficiently performed. The execution time period may be a time period required for the internal pressure of the process chamber 201 to become a set pressure and may be appropriately selected depending on the opening degree of the APC valve 243. In the meantime, if the execution time period is shorter than 1 second, there may be a case where the residual gas removal is not sufficiently performed. The state in which the supply of the N$_2$ gas into the process chamber 201 is stopped includes not only a state in which the supply of the N$_2$ gas into the process chamber 201 is completely stopped but also a state in which the N$_2$ gas is supplied into the process chamber 201 at a low flow rate. That is to say, the state in which the valves 314, 324 and 334 are closed includes not only a state in which all the valves 314, 324 and 334 are completely closed but also a state in which at least one of the valves 314, 324 and 334 is slightly opened without completely closing the same.

At the H$_2$O cycle purge step, a cycle including a step of supplying and exhausting the H$_2$O gas is performed multiple times. By cyclically purging the H$_2$O gas in this way, each time when HF having strong reaction power is generated, it is possible to remove HF from the interior of the process chamber 201. It is preferred that the cycle purge is continuously performed by, for example, 40 cycles or more, or until the execution time period of the step as a whole becomes 20 minutes or more.

The H$_2$O cycle purge step includes a first time period during which a cycle including a step of supplying and exhausting the H$_2$O gas is performed once or a series of multiple times, and a second time period during which such a cycle is performed once or a series of multiple times after the first time period. A process condition in the first time period will be referred to as a first process condition. A process condition in the second time period will be referred to as a second process condition. That is to say, the H$_2$O cycle purge step includes a step of supplying and exhausting the H$_2$O gas to and from the process chamber 201 under the first process condition, and a step of supplying and exhausting the H$_2$O gas to and from the process chamber 201 under the second process condition after the step of supplying and exhausting the H$_2$O gas to and from the process chamber 201 under the first process condition.

In this regard, it is preferred that the first process condition is set to become different from the second process condition so that the reactivity of the residual F component with the H$_2$O gas (i.e., the reactivity of the residual halogen element with the purge gas containing H and O) grows high. By doing so, the following advantages are obtained. First, by purging the process chamber 201 having a large amount of the residual F component under the first process condition, namely through the use of H$_2$O having high reaction energy, it is possible to further promote the reaction of H$_2$O with the residual F component and to remove a large amount of HF which is a reaction product generated by the reaction. By performing the purge operation under the first process condition, the residual F component is removed. That is to say, the deposit such as TiF$_4$ or the like is removed. Thus, at least a portion of the surfaces of the members disposed within the process chamber 201 is exposed. Thereafter, by performing a purge operation under the second process condition, namely through the use of H$_2$O having low reaction energy as compared with the first process condition, it is possible to moderately promote the reaction of H$_2$O with the residual F component and to restrain HF, which is a reaction product generated by the reaction, from reacting with the members (made of quartz or metal) disposed within the process chamber 201. Thus, damage otherwise occurring in the members disposed within the process chamber 201 is reduced. It is therefore possible to protect the members disposed within the process chamber 201.

In order to assure that the reactivity of the residual F component with the H$_2$O gas becomes higher under the first process condition than under the second process condition, for example, the internal temperature of the process chamber 201 under the first process condition may preferably be set higher than the internal temperature of the process chamber 201 under the second process condition. That is to say, the internal temperature of the process chamber 201 under the second process condition may preferably be set lower than the internal temperature of the process chamber 201 under the first process condition.

More specifically, for example, it is preferred that the internal temperature of the process chamber 201 at the H$_2$O cycle purge step is gradually reduced from the start of the H$_2$O cycle purge step toward the end thereof. For example, the internal temperature of the process chamber 201 at the start time of the H$_2$O cycle purge step may be set at the same temperature as the temperature used in the cleaning process (the temperature used when removing the oxide film), namely a temperature which becomes a (predetermined) temperature falling within a range of 100 to 400 degrees C., specifically a temperature which becomes a (predetermined) temperature falling within a range of 200 to 360 degrees C., more specifically a temperature which becomes a (predetermined) temperature falling within a range of 290 to 350 degrees C. The internal temperature of the process chamber 201 at the end time of the H$_2$O cycle purge step may be set at the same temperature as the temperature used in the film forming process (the temperature used when forming the oxide film), namely a temperature which becomes a (predetermined) temperature falling within a range of 25 to 130 degrees C., specifically a temperature which becomes a (predetermined) temperature falling within a range of 50 to 100 degrees C., more specifically a temperature which becomes a (predetermined) temperature falling within a range of 65 to 85 degrees C. That is to say, in the purge process, the temperature may be gradually changed (lowered) from the temperature used in the cleaning process to the temperature used in the film forming process (so that the temperature comes close to the temperature used in the film forming process). Specifically, under the first process condition and the second process condition, the temperature may be gradually lowered from the temperature used in the cleaning process so as to come close to the temperature used in the film forming process. While a linear temperature change is exemplarily shown in FIG. 5A, the method of changing the temperature at the H$_2$O cycle purge step is not limited to the linear temperature change but may be appropriately selected depending on the necessity.

(5) Pre-Coating Process

After the aforementioned purge process is performed and after the internal temperature of the process chamber 201 is lowered to the temperature of the film forming process, a pre-coating process of a TiO film is performed. In the pre-coating process, by performing the same process as the TiO film forming step of the aforementioned film forming process under the same condition as the TiO film forming step in a state in which the empty boat 217 is loaded into the process chamber 201, a TiO film having a (predetermined) thickness of, e.g., 40 nm or more, is formed on the inner wall of the reaction tube 203, the surfaces of the nozzles 410, 420 and 430, the inner wall of the manifold 209, the surface of the boat 217, the upper surface of the seal cap 219 and the surfaces of the heat insulating plates 218. This makes it possible to confine the residual F component which could not be completely removed at the H$_2$O cycle purge step.

(Purge and Return to Atmospheric Pressure)

After the pre-coating process is performed, the valves 314, 324 and 334 are opened. The N$_2$ gas is supplied from the gas supply pipes 310, 320 and 330 into the process chamber 201 and is exhausted from the exhaust pipe 231. The N$_2$ gas acts as a purge gas. Thus, the interior of the process chamber 201 is purged by an inert gas. The gas or the byproduct remaining within the process chamber 201 is removed from the interior of the process chamber 201

(purge). Thereafter, the internal atmosphere of the process chamber 201 is substituted by the inert gas (inert gas substitution). The internal pressure of the process chamber 201 is returned to an atmospheric pressure (return to atmospheric pressure).

(Boat Unloading)

The seal cap 219 is moved down by the boat elevator 115. The lower end of the manifold 209 is opened. Then, the empty boat 217 is unloaded from the lower end of the manifold 209 to the outside of the reaction tube 203 (boat unloading). Thereafter, the aforementioned film forming process is resumed.

(6) Effects According to the Present Embodiment

According to the present embodiment, one or more effects set forth below may be achieved.

(a) By performing the purge process using the $H_2O$ gas after the cleaning process using the $ClF_3$ gas, it is possible to remove the residual F component, which originates from the cleaning gas, from the interior of the process chamber 201.

(b) In the purge process, the step of supplying and exhausting the $H_2O$ gas into and from the process chamber 201 under the first process condition and the step of subsequently supplying and exhausting the $H_2O$ gas into and from the process chamber 201 under the second process condition differing from the first process condition are performed. The first process condition may preferably be a process condition under which the reactivity of the F component with $H_2O$ is higher than that of the second process condition.

First, by performing the purge operation under the first process condition, the reaction of the residual F component with $H_2O$ is promoted and HF is generated. This makes it possible to efficiently remove a large amount of the residual F component. Then, by performing the purge operation under the second process condition, the residual F component is allowed to react with $H_2O$ and the reaction is moderately suppressed. This makes it possible to remove the residual F component while suppressing damage which may occur in the members disposed within the process chamber 201 due to the reaction of HF with the members disposed within the process chamber 201.

(c) For example, if the internal temperature of the process chamber 201 under the second process condition is set lower than the internal temperature of the process chamber 201 under the first process condition, it is possible to assure that the reactivity of the residual F component with $H_2O$ under the first process condition becomes higher than that under the second process condition. For example, if the internal temperature of the process chamber 201 is gradually lowered from the start time of the purge process toward the end time thereof, it is possible to realize such a process temperature condition.

(d) The cleaning process is performed after the film forming process. The purge process is performed after the cleaning process. The film forming process is performed again after the purge process. The process temperature during the cleaning process is higher than the process temperature during the film forming process. Thus, in order to perform the film forming process again after the cleaning process, the internal temperature of the process chamber 201 is lowered from the process temperature during the cleaning process toward the process temperature during the next film forming process.

The purge process is performed between the cleaning process and the next film forming process. Thus, it is preferred that the reactivity of the residual F component with $H_2O$ under the first process condition is made higher than that under the second process condition by making the internal temperature of the process chamber 201 under the first process condition higher than the internal temperature of the process chamber 201 under the second process condition, namely by making the internal temperature of the process chamber 201 under the second process condition lower than the internal temperature of the process chamber 201 under the first process condition. This is because the reactivity of the residual F component with $H_2O$ under the first process condition can be made higher than that under the second process condition by using a temperature change by which the internal temperature of the process chamber 201 is lowered from the process temperature during the cleaning process toward the process temperature during the next film forming process.

(e) By making the temperature at the start time of the purge process equal to the temperature during the cleaning process, it is possible to bring the start time of the purge process forward and to improve the throughput. Furthermore, by making the temperature at the end time of the purge process equal to the temperature during the film forming process, it is possible to perform the next film forming process (or the pre-coating process) immediately after the end of the purge process and to improve the throughput.

(f) By cyclically purging the $H_2O$ gas, each time when HF having strong reaction power is generated, it is possible to remove HF from the interior of the process chamber 201. Thus, it is possible to obtain not only an effect of protecting the members disposed within the process chamber 201 but also an effect of preventing liquefaction of $H_2O$.

(g) At the $H_2O$ purge step, by simultaneously supplying the $H_2O$ gas and the $N_2$ gas, it is possible to supply the $H_2O$ gas in such a way that the $H_2O$ gas is pushed by the $N_2$ gas. This makes it possible to increase the total internal pressure of the process chamber 201 and to increase the reactivity of $H_2O$ with the residual F component. Since the partial pressure of the $H_2O$ gas is reduced, it is desirable to moderately adjust the supply amount of the $N_2$ gas. In the case where the residual F component exists within the nozzles, it is possible to increase the reactivity of $H_2O$ with the residual F component because the internal pressure of the nozzles can be increased by the push action of the $N_2$ gas.

(7) Modifications of Purge Process

The purge process according to the present embodiment is not limited to the form described above but may be modified as in the modifications which will be described below. In the following modifications, the processes other than the purge process are the same as those of the aforementioned embodiment. Even in the following modifications, it is possible to achieve effects similar to those achieved in the aforementioned embodiment.

(Modification 1)

Figure 5B:
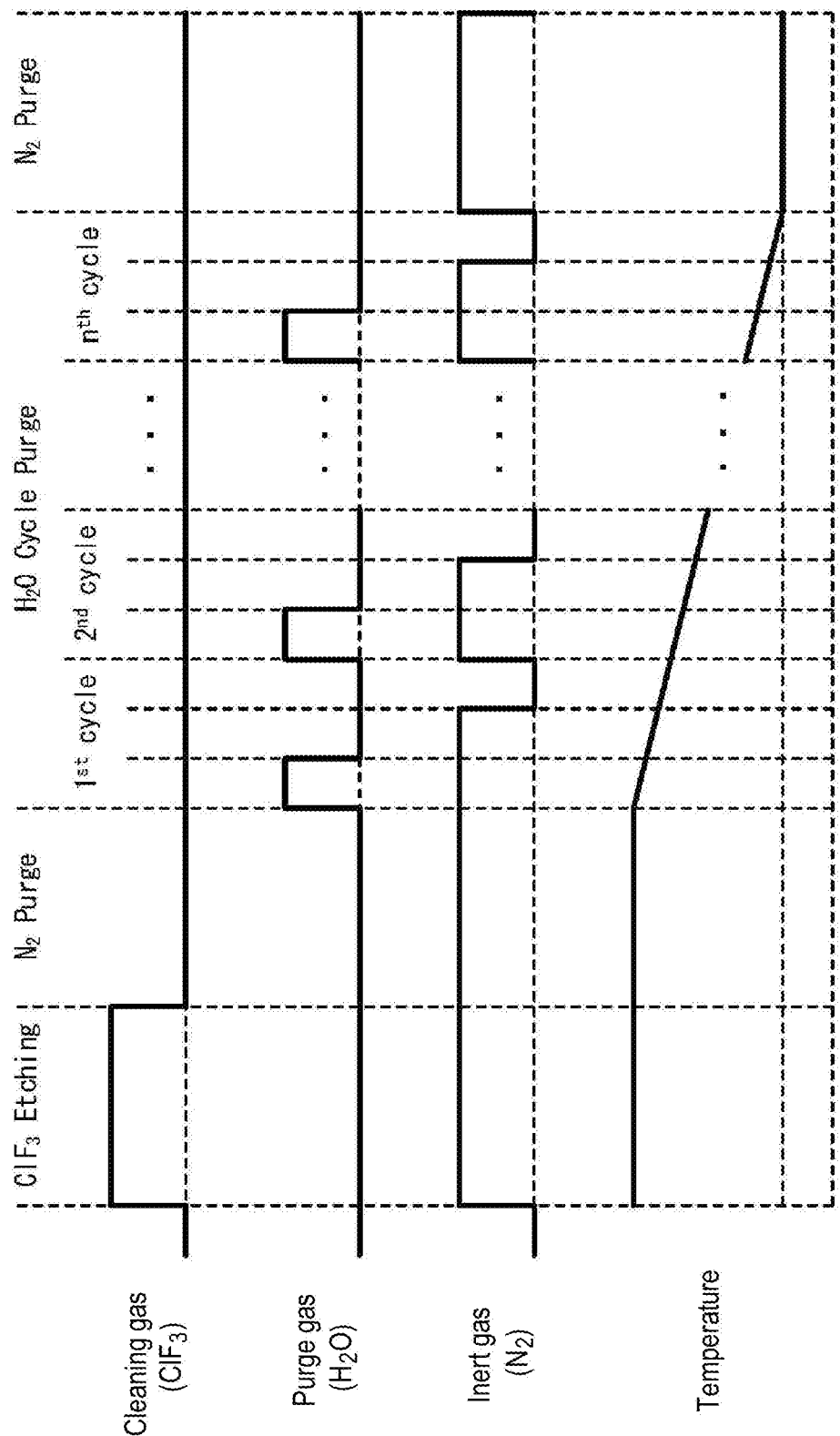
FIG. 5B is a view showing gas supply timings and a change of an internal temperature of a process chamber in a cleaning process and a purge process according to modification 1.

As illustrated in FIG. 5B, it may be possible to add a purge operation using an $N_2$ gas, which is performed after the temperature is lowered to the process temperature of the film forming process at the $H_2O$ cycle purge step. By the added purge operation using the $N_2$ gas, the removal of $H_2O$ used at the $H_2O$ cycle purge step can be reliably performed.

(Modification 2)

As illustrated in FIG. 6A, it may be possible to add a purge operation using an $N_2$ gas, which is performed while lowering the temperature to the process temperature of the film forming process after the end of the $H_2O$ cycle purge step without lowering the temperature to the process temperature of the film forming process at the $H_2O$ cycle purge step. By the added purge operation using the $N_2$ gas, the removal of $H_2O$ used at the $H_2O$ cycle purge step can be reliably performed while using the step of lowering the temperature to the process temperature of the film forming process.

(Modification 3)

Furthermore, as illustrated in FIG. 6B, it may be possible to add a purge operation using an $N_2$ gas, which is performed while lowering the temperature to the process temperature of the film forming process after performing the $H_2O$ cycle purge step at a constant temperature equal to the process temperature of the cleaning process.

In the embodiment (and the modifications) described above, there has been described an example in which the temperatures of the first and second process conditions are made different from each other in order to assure that the reactivity of the residual F component with the $H_2O$ gas becomes higher in the first process condition than in the second process condition.

In order to assure that the reactivity of the residual F component with the $H_2O$ gas becomes higher in the first process condition than in the second process condition, for example, the supply amount of the $H_2O$ gas in the first process condition may be made larger than the supply amount of the $H_2O$ gas in the second process condition. That is to say, the supply amount of the $H_2O$ gas in the second process condition may be made smaller than the supply amount of the $H_2O$ gas in the first process condition. For example, in the case where the supply amount of the $H_2O$ gas is made small, it may be possible to perform at least one of a process of shortening the supply time period of the $H_2O$ gas and a process of reducing the supply flow rate of the $H_2O$ gas.

(Modification 4)

Figure 7A:
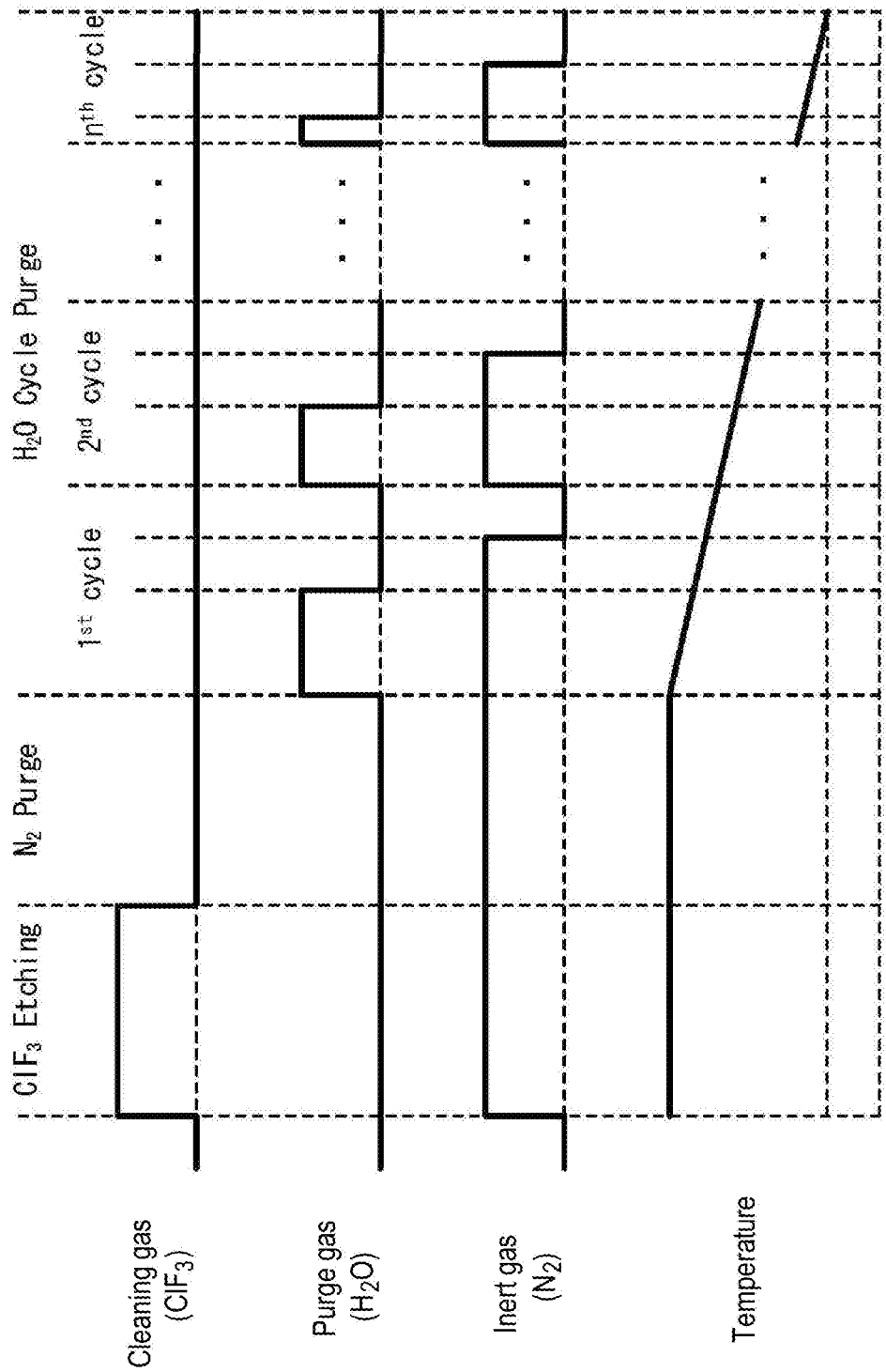
FIG. 7A is a view showing gas supply timings and a change of an internal temperature of a process chamber in a cleaning process and a purge process according to modification 4.

For example, as illustrated in FIG. 7A, the supply time period of the $H_2O$ gas at the $H_2O$ purge step during the $H_2O$ cycle purge step may be gradually shortened from the start time of the $H_2O$ cycle purge step toward the end time thereof while keeping constant the supply flow rate of the $H_2O$ gas.

(Modification 5)

For example, as illustrated in FIG. 7B, the supply flow rate of the $H_2O$ gas at the $H_2O$ purge step during the $H_2O$ cycle purge step may be gradually reduced from the start time of the $H_2O$ cycle purge step toward the end time thereof while keeping constant the supply time period of the $H_2O$ gas.

The method of controlling the reactivity of the residual F component with the $H_2O$ gas using the supply amount of the $H_2O$ gas is effective as a method of controlling the reactivity of the residual F component with the $H_2O$ gas, for example, in the case where the reactivity of the residual F component with the $H_2O$ gas is difficult to control using the temperature in a state in which the temperature is high.

Furthermore, if necessary, the control of the supply amount of the $H_2O$ gas described in modifications 4 and 5 may be performed in combination with the control of the internal temperature of the process chamber 201 described in the aforementioned embodiment. By performing at least one of the control of the internal temperature of the process chamber 201 described in the aforementioned embodiment and the control of the supply amount of the $H_2O$ gas described in modifications 4 and 5, it is possible to assure that the reactivity of the residual F component with the $H_2O$ gas becomes higher in the first process condition than in the second process condition.

Second to Fourth Embodiments of the Present Disclosure

Figure 8:
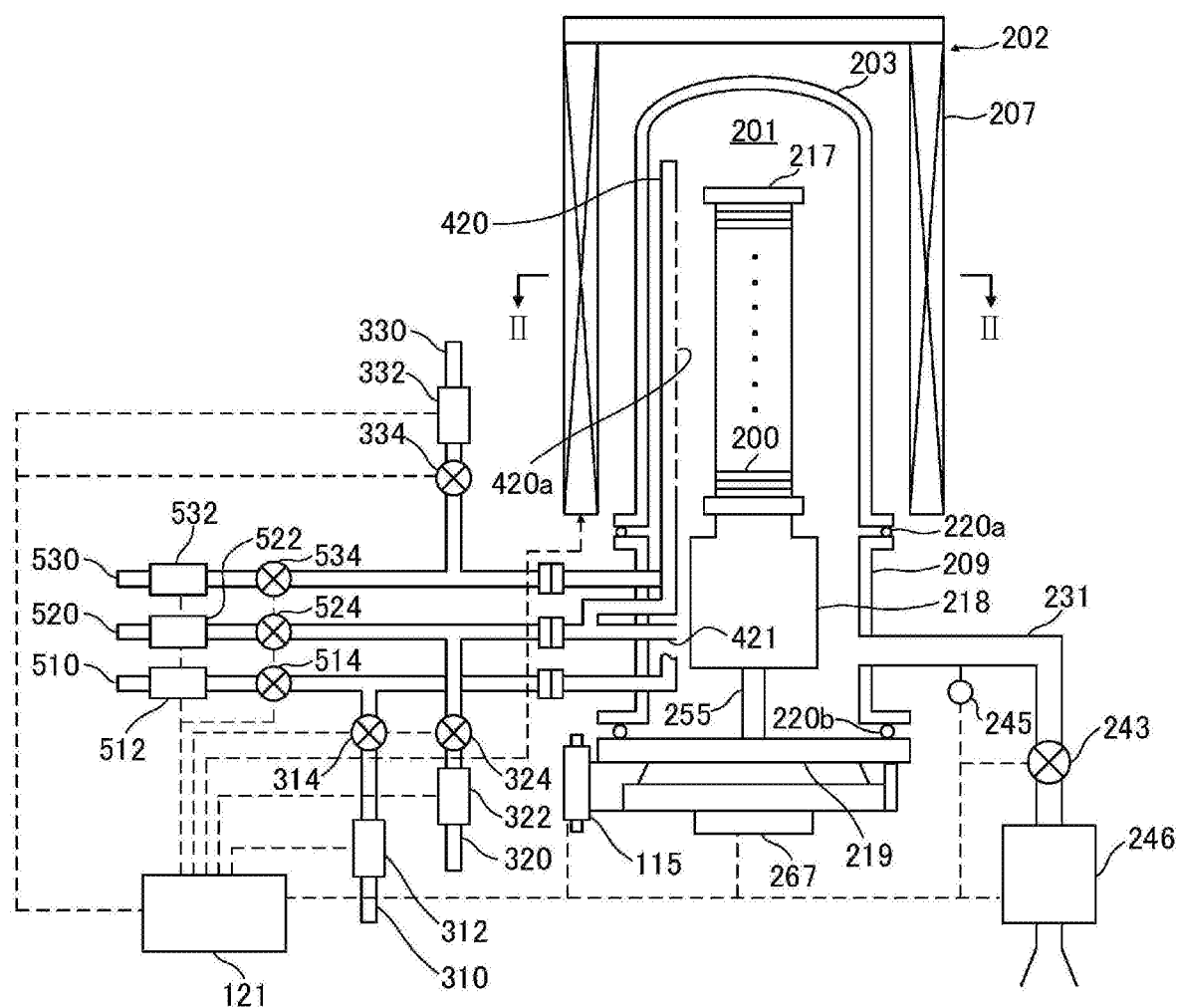
FIG. 8 is a schematic configuration view of a vertical processing furnace of a substrate processing apparatus suitably used in a second embodiment of the present disclosure, in which a portion of the processing furnace is shown in a vertical cross section.
Figure 9:
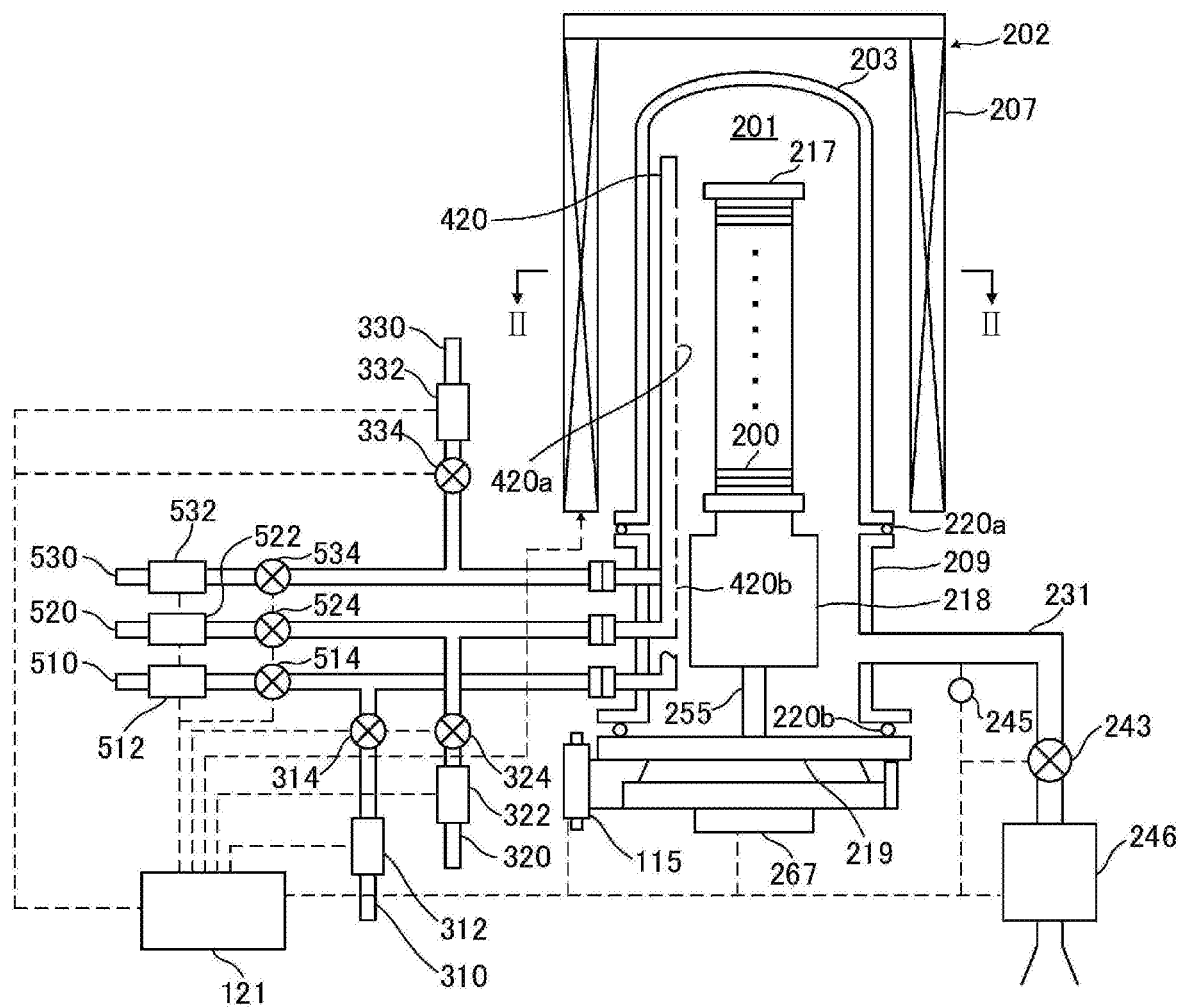
FIG. 9 is a schematic configuration view of a vertical processing furnace of a substrate processing apparatus suitably used in a third embodiment of the present disclosure, in which a portion of the processing furnace is shown in a vertical cross section.
Figure 10:
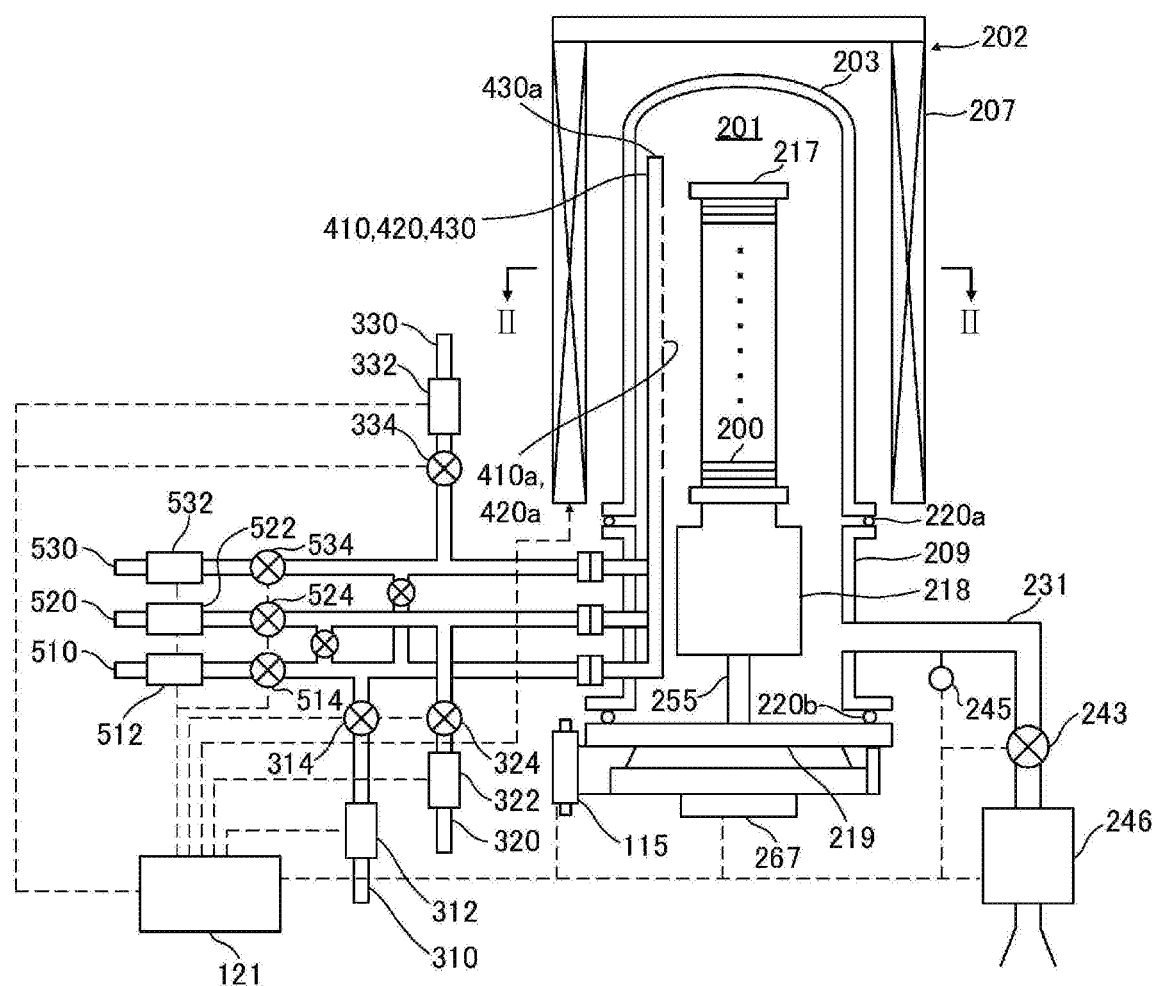
FIG. 10 is a schematic configuration view of a vertical processing furnace of a substrate processing apparatus suitably used in a fourth embodiment of the present disclosure, in which a portion of the processing furnace is shown in a vertical cross section.

Second to fourth preferred embodiments of the present disclosure will now be described with reference to FIGS. 8 to 10. Each of FIGS. 8 to 10 is a schematic configuration view of the processing furnace 202 of the substrate processing apparatus 10 suitably used in second to fourth embodiments of the present disclosure, in which a portion of the processing furnace 202 is shown in a vertical cross section. Hereinafter, the respective embodiments will be described mainly on the basis of differences from the substrate processing apparatus 10 described in the first embodiment. The respective processes performed using the substrate processing apparatus 10 are the same as the respective processes described in the first embodiment. Even in the second to fourth embodiments, it is possible to achieve the same effects as achieved in the first embodiment. The structures of the first to fourth embodiments may be used in combination.

The second embodiment will be described with reference to FIG. 8. In the second embodiment, the structure of the nozzle 420 connected to the gas supply pipe 520 differs from that of the first embodiment. The structures of the nozzles 410 and 430 connected to the gas supply pipes 510 and 530 are the same as those of the first embodiment. For the sake of easier illustration of the nozzle 420, the illustration of the nozzles 410 and 430 is appropriately simplified.

The residual F component as $TiF_4$ or the like is easy to adhere to the lower portion of the process chamber 201, namely the furnace opening portion, which is a region where the wafers 200 do not exist (are not disposed). Thus, in the second embodiment, there is provided a structure in which not only the nozzle 420 described above but also a nozzle 421 is connected to the gas supply pipe 520 through which the $H_2O$ gas flows. The nozzle 421 is formed of a short pipe nozzle, the end portion of which is opened toward the center of the reaction tube 203 at a height equal to or smaller than the height of the upper end of the furnace opening portion so that the $H_2O$ gas is easy to flow toward the furnace opening portion. By allowing the $H_2O$ gas to flow from the nozzle 421 toward the furnace opening portion, it is possible to effectively perform the removal of the residual F component. Alternatively, the nozzle 421 may be formed of an L-shaped short nozzle rather than the short pipe nozzle described above. For example, the vertical portion of the nozzle 421 may be installed in an annular space defined between the inner wall of the reaction tube 203 and the boat 217, so that the vertical portion of the nozzle 421 extends upward (upward in the stacking direction of the wafers 200) along the inner wall of the reaction tube 203. In this case, the height of the vertical portion of the nozzle 421 is set at such a height that the vertical portion of the nozzle 421 is positioned lower than the boat 217, specifically lower than the wafer stacking region. Gas supply holes opened toward the center of the reaction tube 203 and configured to supply (inject) gases therethrough are formed on the side surface of the nozzle 421.

The third embodiment will be described with reference to FIG. 9. In the third embodiment, the structure of the nozzle 420 connected to the gas supply pipe 520 differs from that of the first embodiment. The structures of the nozzles 410 and 430 connected to the gas supply pipes 510 and 530 are the same as those of the first embodiment. For the sake of easier illustration of the nozzle 420, the illustration of the nozzles 410 and 430 is appropriately simplified.

As described in the second embodiment, the F component is easy to remain in the furnace opening portion. Thus, in the third embodiment, there is provided a structure in which not only the gas supply holes 420a disposed above the furnace opening portion as described above but also gas supply holes 420b are formed in the nozzle 420. The gas supply holes 420b are formed on the side surface of the nozzle 420 in a plural number at a height equal to or smaller than the height of the upper end of the furnace opening portion and are opened toward the center of the reaction tube 203. By allowing the H₂O gas to flow from the gas supply holes 420b toward the furnace opening portion, it is possible to effectively perform the removal of the residual F component.

The fourth embodiment will be described with reference to FIG. 10. In the fourth embodiment, the structures of the gas supply pipes 510, 520 and 530 differ from those of the first embodiment. There is provided a structure in which the gas supply pipe 530 for allowing the ClF₃ gas to flow therethrough and the gas supply pipe 520 for allowing the H₂O gas to flow therethrough are respectively connected to the gas supply pipe 510 for allowing the TiCl₄ gas to flow therethrough.

In the film forming process, there may be a case where a TiO film is formed inside the nozzle 410 for allowing the TiCl₄ gas to flow therethrough. Since the gas supply pipe 530 and the gas supply pipe 520 are connected to the gas supply pipe 510, the ClF₃ gas flows even through the nozzle 410 in the cleaning process. It is therefore possible to perform the cleaning of the interior of the nozzle 410. Furthermore, the H₂O gas flows even through the nozzle 410 in the purge process. It is therefore possible to perform the removal of the residual F component remaining within the nozzle 410. That is to say, the ClF₃ gas is supplied into the process chamber 201 through the line independent from the line for supplying the TiCl₄ gas and through the line for supplying the TiCl₄. The H₂O gas is supplied into the process chamber 201 through the line independent from the line for supplying the TiCl₄ gas and through the line for supplying the TiCl₄.

Other Embodiments of the Present Disclosure

While the embodiments of the present disclosure have been specifically described above, the present disclosure is not limited to the aforementioned embodiments but may be differently modified without departing from the spirit of the present disclosure.

Figure 11:
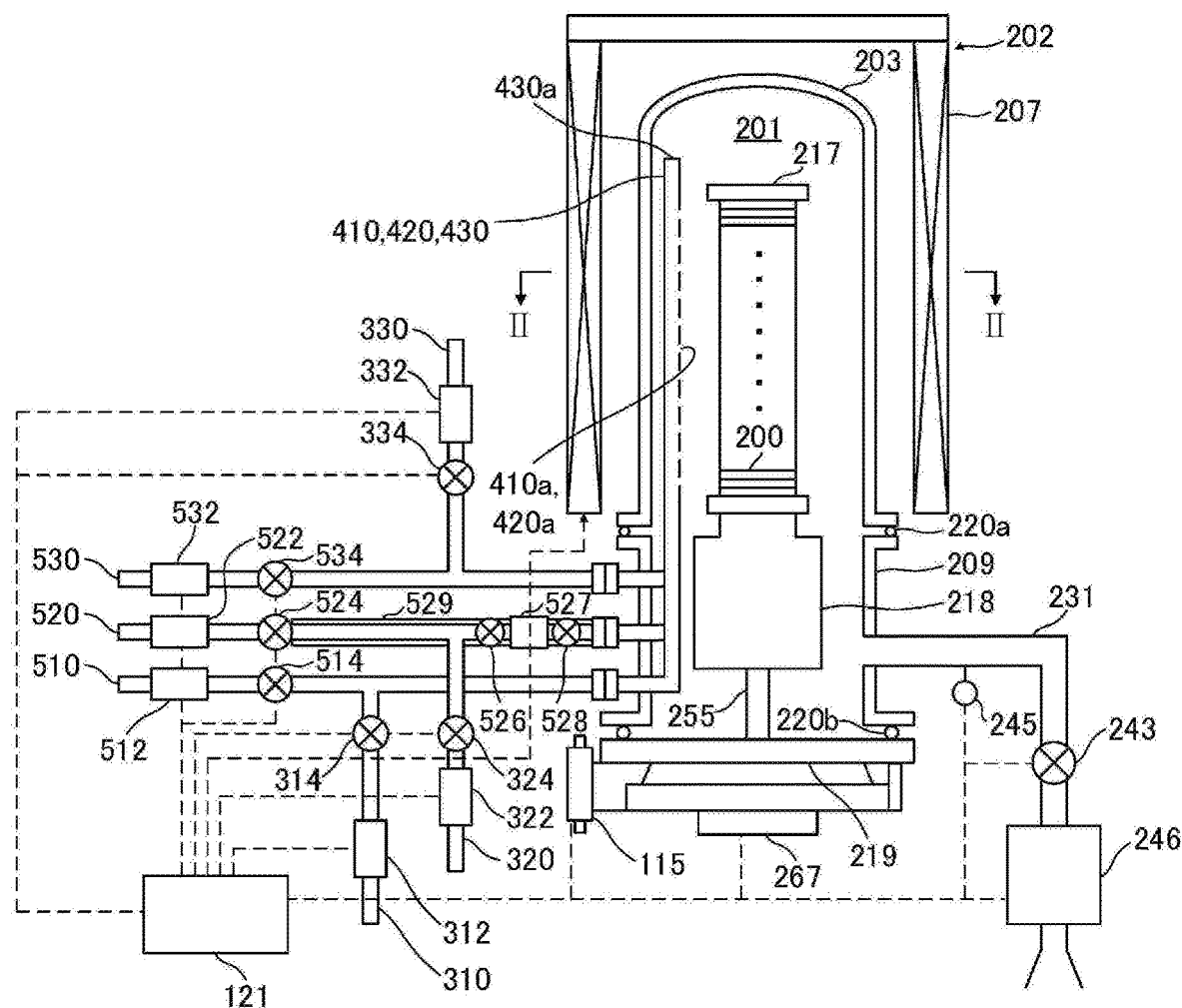
FIG. 11 is a schematic configuration view of a vertical processing furnace of a substrate processing apparatus suitably used in other embodiment of the present disclosure, in which a portion of the processing furnace is shown in a vertical cross section.

For example, during the purge process, the H₂O gas may be stored in a tank or a pipe and may be instantly supplied into the process chamber 201 (flash flow). The internal pressure of the process chamber 201 may be controlled to become a reduced pressure. A flow may be generated within the process chamber 201 by the pressure regulation of the APC valve 243. This makes it possible to evenly diffuse the H₂O gas into the process chamber 201 and to enhance the removal efficiency of the residual F component. A configuration example of the substrate processing apparatus 10 capable of performing the flash flow is illustrated in FIG. 11. A tank 527 is installed in the gas supply pipe 520 for allowing the H₂O gas to flow therethrough. Valves 526 and 528 are respectively installed at the upstream side and the downstream side of the tank 527.

Furthermore, for example, during the purge process, the pipe temperature of the gas supply pipe 520 for allowing the H₂O gas to flow therethrough may be set higher than the pipe temperature during the cleaning process. The pressure, flow rate and energy become higher as the pipe temperature increases. Presumably, this makes it possible to enhance the removal efficiency of the residual F component. A configuration example of the substrate processing apparatus 10 capable of increasing the pipe temperature of the gas supply pipe 520 is illustrated in FIG. 11. For example, a tape heater 529 which covers the gas supply pipe 520 is provided at the downstream side of the valve 524. By the tape heater 529, the temperature of the gas supply pipe 520 can be increased to, for example, 120 degrees C. (with respect to a typical temperature of, e.g., 75 degrees C.). The temperature thus increased may be a temperature at which dew condensation does not occur.

Furthermore, for example, in the aforementioned embodiments, the ClF₃ gas has been illustrated as the cleaning gas. However, it may be possible to use other cleaning gases as long as they contain a halogen element. As the cleaning gases containing a halogen element, it may be possible to use, in addition to the ClF₃ gas, fluorine-containing cleaning gases such as, e.g., a fluorine (F₂) gas, a nitrogen trifluoride (NF₃) gas or the like.

Furthermore, for example, in the aforementioned embodiments, the H₂O gas has been illustrated as the purge gas used in the purge process for removing the residual halogen element originating from the cleaning gas. However, it may be possible to use other purge gases as long as they contain H and O. As the purge gas containing H and O, it may be possible to separately supply H₂ and O₂ rather than to supply H₂O as water vapor. H₂ and O₂ may be activated and may be used as hydrogen radical and oxygen radical or as atomic hydrogen and atomic oxygen. H₂O may be generated within the process chamber 201. In addition, it is not essential that the O-containing gas used in the film forming process and the H- and O-containing purge gas used in the purge process be the same gas (the gas of the same kind). However, if the O-containing gas used in the film forming process and the H- and O-containing purge gas used in the purge process are the same gas, it is possible to reduce the kinds of process gases.

Furthermore, in the aforementioned embodiments, the N₂ gas has been illustrated as the inert gas. However, as the inert gas, it may be possible to use, in addition to the N₂ gas, a rare gas such as, e.g., an Ar gas, a He gas, a Ne gas or a Xe gas.

Furthermore, for example, in the aforementioned embodiments, there have been illustrated the cleaning process and the purge process which are performed after the TiO film is formed using Ti as a metal element in the film forming process. However, the applicable film type is not limited to the TiO film but may be any film type for which gas cleaning is performed using a cleaning gas containing a halogen element. For example, the present disclosure may be suitably applied to a case where an oxide film containing an element other than Ti, such as tantalum (Ta), tungsten (W), cobalt (Co), yttrium (Y), ruthenium (Ru), aluminum (Al), hafnium (Hf), zirconium (Zr), molybdenum (Mo) or the like, is formed.

In the case of forming films containing the aforementioned elements, it may be possible to use, as the precursor gas, not only a titanium (Ti)-containing gas but also a tantalum (Ta)-containing gas, a tungsten (W))-containing gas, a cobalt (Co))-containing gas, an yttrium (Y))-containing gas, a ruthenium (Ru))-containing gas, an aluminum (Al))-containing gas, a hafnium (Hf))-containing gas, a zirconium (Zr))-containing gas, a molybdenum (Mo))-containing gas or the like.

In the case of forming films containing the aforementioned elements, it may be possible to use, as the precursor gas, not only TiCl₄ but also, for example, tetrafluoride titanium (TiF₄), tetrakis(diethylamino) titanium (Ti[(C₂H₅)₂N]₄, abbreviation: TDEAT), tetrakis(dimethylamino) titanium (Ti[N(CH₃)₂]₄, abbreviation: TDMAT), tantalum pentachloride (TaCl₅), tantalum pentafluoride (TaF₅), pentaethoxy tantalum (Ta(OC₂H₅)₅, abbreviation: PET), tungsten hexachloride (WCl₆), tungsten hexafluoride (WF₆), bis(tert-butylimino)bis(tert-butylamino) tungsten ((C₄H₉NH)₂W(C₄H₉N)₂), tungsten hexacarbonyl (W(CO)₆), cobalt dichloride ($CoCl_2$), cobalt difluoride ($CoF_2$), bis(ethylcyclopentadienyl) cobalt ($C_{14}H_{18}Co$), cobalt hexacarbonyl ($CoCO)_6$), yttrium trichloride ($YCl_3$), yttrium trifluoride ($YF_3$), tris(butylcyclopentadienyl) yttrium ($Y(C_5H_4CH_2(CH_2)_2CH_3)_3$), ruthenium trichloride ($RuCl_3$), ruthenium trifluoride ($RuF_3$), bis(ethylcyclopentadienyl) ruthenium ($C_{14}H_{18}Ru$), aluminum trichloride ($AlCl_3$), aluminum trifluoride ($AlF_3$), trimethyl aluminum (($CH_3)_3Al$, abbreviation: TMA), hafnium tetrachloride ($HfCl_4$), hafnium tetrafluoride ($HfF_4$), tetrakis(ethylmethylamino) hafnium ($Hf[N(CH_3)CH_2CH_3]_4$, abbreviation: TEMAH), tetrakis (dimethylamino) hafnium ($Hf[N(CH_3)_2]_4$, abbreviation: TDMAH), tetrakis(diethylamino) hafnium ($Hf[N(C_2H_5)_2]_4$, abbreviation: TDEAH), zirconium tetrachloride ($ZrCl_4$), zirconium tetrafluoride ($ZrF_4$), tetrakis(ethylmethylamino) zirconium ($Zr[N(CH_3)CH_2CH_3]_4$, abbreviation: TEMAZ), tetrakis(dimethylamino) zirconium ($Zr[N(CH_3)_2]_4$, abbreviation: TDMAZ), or tetrakis(diethylamino) zirconium ($Zr[N(C_2H_5)_2]_4$, abbreviation: TDEAZ).

In the case of forming films containing the aforementioned elements, it may be possible to use, as the reaction gas, not only the $H_2O$ gas but also, for example, ozone ($O_3$), plasma-excited oxygen ($O_2$), water vapor ($H_2O$), hydrogen peroxide ($H_2O_2$), nitrous oxide ($N_2O$), or a mixed gas of plasma-excited $O_2$ and $H_2$. Furthermore, it may be possible to separately supply $H_2$ and $O_2$ rather than to supply $H_2O$ as water vapor. $H_2$ and $O_2$ may be activated and may be used as hydrogen radical and oxygen radical or as atomic hydrogen and atomic oxygen. $H_2O$ may be generated within the process chamber 201.

The films containing the aforementioned elements include not only the TiO film but also oxide films such as, e.g., a tantalum oxide film (TaO film), a tungsten oxide film (WO film), a cobalt oxide film (CoO film), an yttrium oxide film (YO film), a ruthenium oxide film (RuO film), an aluminum oxide film (AlO film), a hafnium oxide film (HfO film), a zirconium oxide film (ZrO film) or the like.

As described above, the present disclosure may be suitably applied to a case where a cleaning process of removing a deposit including an oxide film other than the TiO film is performed and then a purge process of removing a residual halogen element originating from a cleaning gas is performed. Even in this case, the processing procedures and the processing conditions of the cleaning process or the processing procedures and the processing conditions of the purge process may be similar to the processing procedures and the processing conditions of the aforementioned embodiments. Even in this case, effects similar to those of the aforementioned embodiments and modifications are achieved.

Recipes (programs in which processing procedures and processing conditions are written) used in the substrate processing process may be prepared individually according to the processing contents (the kind, composition ratio, quality, film thickness or the like of the film as formed) and may be stored in the memory device 121c via a telecommunication line or the external memory device 123. Moreover, at the start of the substrate processing process, the CPU 121a may properly select an appropriate recipe from the recipes stored in the memory device 121c according to the processing contents. This enables a single substrate processing apparatus to form films of different kinds, composition ratios, film qualities and thicknesses with enhanced reproducibility. In addition, it is possible to reduce an operator's burden (a burden borne by an operator when inputting the processing procedures and conditions, or the like) and to quickly start the substrate processing process while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiments, there has been described an example where films are formed using a batch type substrate processing apparatus capable of processing a plurality of substrates at a time. The present disclosure is not limited to the aforementioned embodiments but may be suitably applied to, for example, a case where films are formed using a single-substrate-type substrate processing apparatus capable of processing a single substrate or several substrates at a time. In addition, in the aforementioned embodiments, there has been described an example where films are formed using a substrate processing apparatus provided with a hot-wall-type processing furnace. The present disclosure is not limited to the aforementioned embodiments but may be suitably applied to a case where films are formed using a substrate processing apparatus provided with a cold-wall-type processing furnace. Even in these cases, the processing procedures and processing conditions may be similar to, for example, the processing procedures and processing conditions of the aforementioned embodiments.

Figure 12:
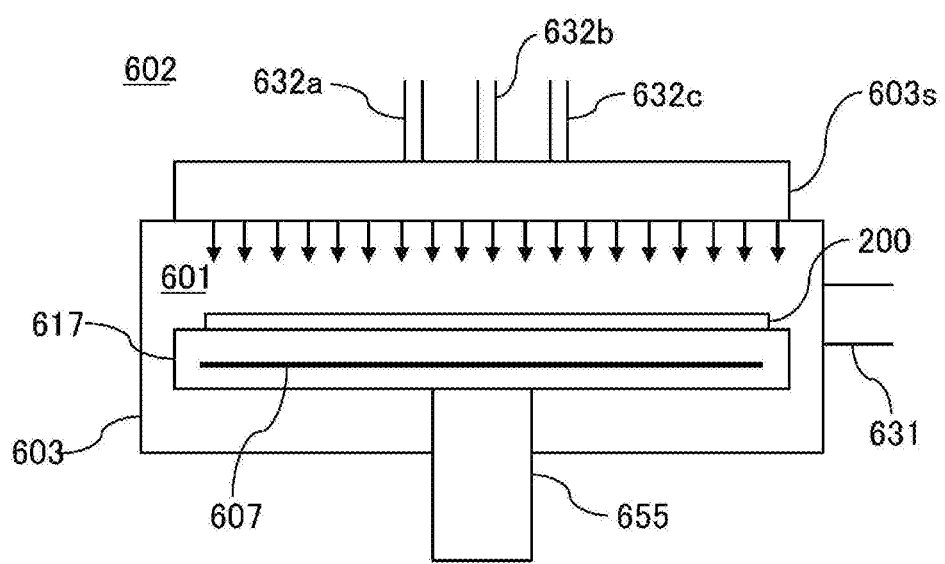
FIG. 12 is a schematic configuration view of a processing furnace of a substrate processing apparatus suitably used in other embodiment of the present disclosure, in which a portion of the processing furnace is shown in a vertical cross section.

The present disclosure may be suitably applied to, for example, a case where a film is formed using a single-substrate-type substrate processing apparatus provided with a processing furnace 602 illustrated in FIG. 12. The processing furnace 602 includes a process vessel 603 which defines a process chamber 601, a shower head 603s as a gas supply part configured to supply a gas into the process chamber 601 in a shower-like manner, a support table 617 configured to horizontally support one or more wafers 200, a rotary shaft 655 configured to support the support table 617 from below, and a heater 607 installed in the support table 617. Gas supply ports 632a, 632b and 632c are connected to inlets (gas introduction holes) of the shower head 603s. A gas supply system similar to the precursor gas supply system of the aforementioned embodiments is connected to the gas supply port 632a. A gas supply system similar to the O-containing gas supply system and the H- and O-containing purge gas supply system of the aforementioned embodiments is connected to the gas supply port 632b. A gas supply system similar to the cleaning gas supply system of the aforementioned embodiments is connected to the gas supply port 632c. A gas distribution plate configured to supply a gas into the process chamber 601 in a shower-like manner is installed in outlets (gas discharge holes) of the shower head 603s. The shower head 603s is installed in such a position as to face the surface of the wafer 200 loaded into the process chamber 601. An exhaust port 631 configured to evacuate the interior of the process chamber 601 is provided in the process vessel 603. An exhaust system similar to the exhaust system of the aforementioned embodiments is connected to the exhaust port 631.

However, in the case where the purge process using the $H_2O$ gas is performed through the use of the single-substrate-type substrate processing apparatus 10, $H_2O$ may remain within the process chamber 601 (a $H_2O$ remaining atmosphere may be generated). Furthermore, if F remains within the shower head 603s, there is a possibility that H$_2$O is liquefied upon supplying H$_2$O into the shower head 603s. Accordingly, it is preferred that an N$_2$ purge operation is performed after the purge process using the H$_2$O gas and the interior of the shower head 603s is vacuum-drawn during the N$_2$ purge operation. By supplying an N$_2$ gas into the process chamber 601 and vacuum-drawing the interior of the process chamber 601 while vacuum-drawing the interior of the shower head 603s, H$_2$O remaining within the process chamber 601 is caused to flow over the shower head 603s and is removed.

Figure 13:
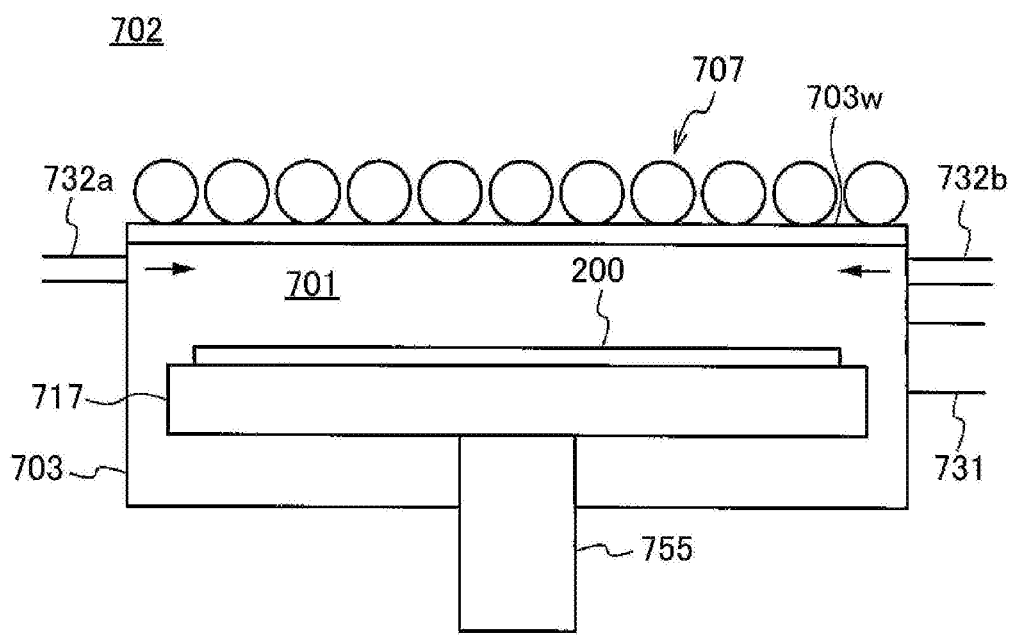
FIG. 13 is a schematic configuration view of a processing furnace of a substrate processing apparatus suitably used in other embodiment of the present disclosure, in which a portion of the processing furnace is shown in a vertical cross section.

In addition, the present disclosure may be suitably applied to, for example, a case where a film is formed using a substrate processing apparatus provided with a processing furnace 702 illustrated in FIG. 13. The processing furnace 702 includes a process vessel 703 which defines a process chamber 701, a support table 717 configured to horizontally support one or more wafers 200, a rotary shaft 755 configured to support the support table 717 from below, a lamp heater 707 configured to irradiate light toward the wafer 200 accommodated within the process vessel 703, and a quartz window 703w which transmits the light irradiated from the lamp heater 707. A gas supply port 732a for supplying the aforementioned precursor gas and a gas supply port 732b for supplying the aforementioned reaction gas are connected to the process vessel 703. A precursor gas supply system similar to the precursor gas supply system of the aforementioned embodiments is connected to the gas supply port 732a. A reaction gas supply system similar to the reaction gas supply system of the aforementioned embodiments is connected to the gas supply port 732b. An exhaust port 731 configured to evacuate the interior of the process chamber 701 is installed in the process vessel 703. An exhaust system similar to the exhaust system of the aforementioned embodiments is connected to the exhaust port 731.

The lamp heater 707 may be, for example, a mercury lamp that generates ultraviolet (UV) light using the bright line emission of mercury. Furthermore, the lamp heater 707 may be a lamp in which amalgam, alloy of mercury and metal, is coated on an inner surface of a quartz tube. In addition, as the lamp heater 707, it may be possible to use a plurality of straight-tube-type mercury lamps arranged parallel to each other, a plurality of U-shaped mercury lamps arranged parallel to each other, or a horseshoe-shaped mercury lamp.

Even in the case of using these substrate processing apparatuses, a film forming process, a cleaning process or a purge process may be performed according to the sequences and processing conditions similar to those of the embodiments and modifications described above. It is also possible to achieve effects similar to those of the embodiments and modifications described above.

The embodiments and modifications described above may be appropriately combined with one another. In addition, the processing conditions used at this time may be similar to, for example, the processing conditions of the embodiments described above.

According to the present disclosure in some embodiments, it is possible to provide a technique of removing a residual halogen element originating from a cleaning gas from an interior of a process chamber and forming a high-quality film on a substrate.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   (a) under a first process condition where an internal temperature of a process chamber is a first temperature, performing a first cycle multiple times, the first cycle including alternately supplying a first purge gas containing hydrogen and oxygen to the process chamber and exhausting the first purge gas from the process chamber;
   (b) under a second process condition where the internal temperature of the process chamber is a second temperature that is lower than the first temperature, performing a second cycle multiple times, the second cycle including alternately supplying a second purge gas containing hydrogen and oxygen to the process chamber and exhausting the second purge gas from the process chamber after performing (a); and
   (c) under a third process condition where the internal temperature of the process chamber is a third temperature that is equal to or higher than the first temperature, supplying a halogen-element-containing cleaning gas to the process chamber to:
      remove from the process chamber an oxide film that has adhered to an internal member of the process chamber at a fourth temperature, which is equal to or lower than the second temperature; and
      form a deposit including a halogen element contained in the halogen-element-containing cleaning gas, which is generated by a reaction between the halogen-element-containing cleaning gas and the oxide film, on a surface of the internal member of the process chamber,
   wherein, in (a), the deposit formed in (c) reacts with the first purge gas under the first process condition and is removed from the surface of the internal member of the process chamber until at least a portion of the surface of the internal member of the process chamber is exposed,
   wherein, in (b), the deposit remaining within the process chamber after performing (a) reacts with the second purge gas, under the second process condition, and
   wherein a reaction energy of the second purge gas in (b) is lower than a reaction energy of the first purge gas in (a).

2. The method of claim 1, further comprising (d) forming an oxide film on a substrate accommodated within the process chamber by supplying a precursor gas and an oxygen-containing gas to the substrate before performing (c), the oxide film further adhering to the internal member within the process chamber,
   wherein a cycle, in which (d), (c), (a), and (b) are performed sequentially, is repeated,
   wherein an internal temperature of the process chamber when the oxide film adheres to the internal member is the fourth temperature that is lower than the third temperature,
   wherein an internal temperature of the process chamber when (a) starts in each cycle is set at the same temperature as the third temperature in (c) of the same cycle, and wherein an internal temperature of the process chamber when (b) ends in each cycle is set at the same temperature as the fourth temperature in (d) of a next cycle.

3. The method of claim 1, further comprising forming an oxide film on a substrate accommodated within the process chamber by supplying a precursor gas and an oxygen-containing gas to the substrate before performing (c), the oxide film further adhering to the internal member within the process chamber.

4. The method of claim 3, wherein the third temperature is higher than a temperature in the act of forming the oxide film on the substrate.

5. The method of claim 4, wherein a composition of the oxygen-containing gas is the same as a composition of the first purge gas and a composition of the second purge gas.

6. The method of claim 1, wherein an amount of the second purge gas supplied to the process chamber under the second process condition is smaller than an amount of the first purge gas supplied to the process chamber under the first process condition.

7. The method of claim 4, wherein in the act of forming the oxide film, the oxygen-containing gas is supplied to a region in which the substrate exists, and
in (a) and (b), the first purge gas and the second purge gas are supplied to a region in which the substrate exists and a region which exists in a lower portion of the process chamber and in which the substrate does not exist.

8. The method of claim 1, wherein in (a) and (b), an internal pressure of the process chamber is controlled by a pressure regulation part such that the first purge gas and the second purge gas are instantly supplied.

9. The method of claim 4, wherein the precursor gas is supplied through a first line, and the cleaning gas is supplied to the process chamber through a second line separated from the first line.

10. The method of claim 9, wherein the cleaning gas is further supplied to the process chamber through the first line.

11. The method of claim 4, wherein the precursor gas is supplied through a first line, and the first purge gas and the second purge gas are supplied to the process chamber through a second line separated from the first line and through the first line.

12. A non-transitory computer-readable recording medium storing a program that causes a computer to perform:
(a) under a first process condition where an internal temperature of a process chamber is a first temperature, performing a first cycle multiple times, the first cycle including alternately supplying a first purge gas containing hydrogen and oxygen to the process chamber and exhausting the first purge gas from the process chamber;
(b) under a second process condition where the internal temperature of the process chamber is a second temperature that is lower than the first temperature, performing a second cycle multiple times, the second cycle including alternately supplying a second purge gas containing hydrogen and oxygen to the process chamber and exhausting the second purge gas from the process chamber after performing (a); and
(c) under a third process condition where the internal temperature of the process chamber is a third temperature that is equal to or higher than the first temperature, supplying a halogen-element-containing cleaning gas to the process chamber to:
remove from the process chamber an oxide film that has adhered to an internal member of the process chamber at a fourth temperature, which is equal to or lower than the second temperature; and
form a deposit including a halogen element contained in the halogen-element-containing cleaning gas, which is generated by a reaction between the halogen-element-containing cleaning gas and the oxide film, on a surface of the internal member of the process chamber,
wherein, in (a), the deposit formed in (c) reacts with the first purge gas under the first process condition and is removed from the surface of the internal member of the process chamber until at least a portion of the surface of the internal member of the process chamber is exposed,
wherein, in (b), the deposit remaining within the process chamber after performing (a) reacts with the second purge gas, under the second process condition, and
wherein a reaction energy of the second purge gas in (b) is lower than a reaction energy of the first purge gas in (a).

13. A method of manufacturing a semiconductor device, comprising:
(a) performing a first cycle multiple times, the first cycle including alternately supplying a first purge gas containing hydrogen and oxygen to a process chamber to which a halogen-element-containing cleaning gas has been supplied to:
remove an oxide film that has been adhered to an internal member of the process chamber; and
form a deposit including a halogen element contained in the halogen-element-containing cleaning gas, which is generated by a reaction between the halogen-element-containing cleaning gas and the oxide film, on a surface of the internal member of the process chamber, and
exhausting the first purge gas from the process chamber under a first process condition where an amount of the first purge gas supplied to the process chamber is a first amount, the cleaning gas having been supplied to the process chamber before performing (a); and
(b) performing a second cycle multiple times, the second cycle including alternately supplying a second purge gas containing hydrogen and oxygen to the process chamber and exhausting the second purge gas from the process chamber after performing (a) under a second process condition where an amount of the second purge gas supplied to the process chamber is a second amount smaller than the first amount,
wherein, in (a), the deposit reacts with the first purge gas under the first process condition and is removed from the surface of the internal member of the process chamber until at least a portion of the surface of the internal member of the process chamber is exposed,
wherein, in (b), the deposit remaining within the process chamber after performing (a) reacts with the second purge gas, under the second process condition, and
wherein a reaction energy of the second purge gas in (b) is lower than a reaction energy of the first purge gas in (a).

14. The method of claim 13, wherein the amount of the first purge gas is controlled by varying a supply time period of the first purge gas, and the amount of the second purge gas is controlled by varying a supply time period of the second purge gas.

15. The method of claim 13, wherein the amount of the first purge gas is controlled by varying flow rate of the first purge gas, and the amount of the second purge gas is controlled by varying flow rate of the second purge gas.

16. The method of claim 1, wherein the deposit is generated by a bond between the halogen element and an element contained in the oxide film in the reaction between the halogen-element-containing cleaning gas and the oxide film.

* * * * *